US012575167B2

(12) United States Patent
Fujii et al.

(10) Patent No.: US 12,575,167 B2
(45) Date of Patent: Mar. 10, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Hidenori Fujii, Tokyo (JP); Koji Tanaka, Tokyo (JP); Sho Tanaka, Tokyo (JP); Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 420 days.

(21) Appl. No.: 18/298,030

(22) Filed: Apr. 10, 2023

(65) Prior Publication Data

US 2024/0072043 A1 Feb. 29, 2024

(30) Foreign Application Priority Data

Aug. 24, 2022 (JP) ................................. 2022-132958

(51) Int. Cl.
*H10D 84/60* (2025.01)
*H01L 23/34* (2006.01)
(Continued)

(52) U.S. Cl.
CPC ........... *H10D 84/617* (2025.01); *H01L 23/34* (2013.01); *H10D 12/038* (2025.01); *H10D 12/481* (2025.01)

(58) Field of Classification Search
CPC .. H10D 84/617; H10D 12/038; H10D 12/481; H10D 8/00; H10D 8/422;
(Continued)

(56) References Cited

U.S. PATENT DOCUMENTS

2016/0260810 A1   9/2016   Sakai
2022/0102341 A1   3/2022   Kudo et al.
2022/0238513 A1*  7/2022   Ikeda ................... H10D 62/127

FOREIGN PATENT DOCUMENTS

JP       2016-162975 A      9/2016
JP       2017-079324 A      4/2017
(Continued)

OTHER PUBLICATIONS

An Office Action; "Notice of Reasons for Refusal," mailed by the Japanese Patent Office on Apr. 22, 2025, which corresponds to Japanese Patent Application No. 2022-132958 and is related to U.S. Appl. No. 18/298,030; with English language translation.

*Primary Examiner* — Mohammad A Rahman
(74) *Attorney, Agent, or Firm* — Studebaker Brackett PLLC

(57) ABSTRACT

To provide a semiconductor device that includes: a semiconductor substrate provided with a semiconductor portion that is at least one of a gate insulating film, a pn junction, or a drift layer of a terminal region; an insulating film provided on the semiconductor portion; a metal electrode having an opening that overlaps the semiconductor portion in plan view and is provided on a side opposite to the semiconductor portion with respect to the insulating film in cross-sectional view; and a plated electrode provided at at least a portion of an inside of the opening using the metal electrode as a material to be plated.

13 Claims, 26 Drawing Sheets

CROSS-SECTION H-H

(51) Int. Cl.
  *H10D 12/00* (2025.01)
  *H10D 12/01* (2025.01)
(58) Field of Classification Search
  CPC ........... H10D 30/6737; H10D 30/6743; H10D
        62/106; H10D 62/112; H10D 62/126;
          H10D 62/127; H10D 62/83; H10D
        62/8325; H10D 64/117; H10D 64/62;
          H10D 84/811; H10D 84/01; H10D
                  64/231; H01L 23/34
  See application file for complete search history.

(56)             References Cited

FOREIGN PATENT DOCUMENTS

| | | |
|---|---|---|
| JP | 2018-120879 A | 8/2018 |
| JP | 2022-056498 A | 4/2022 |

* cited by examiner

F I G.　1
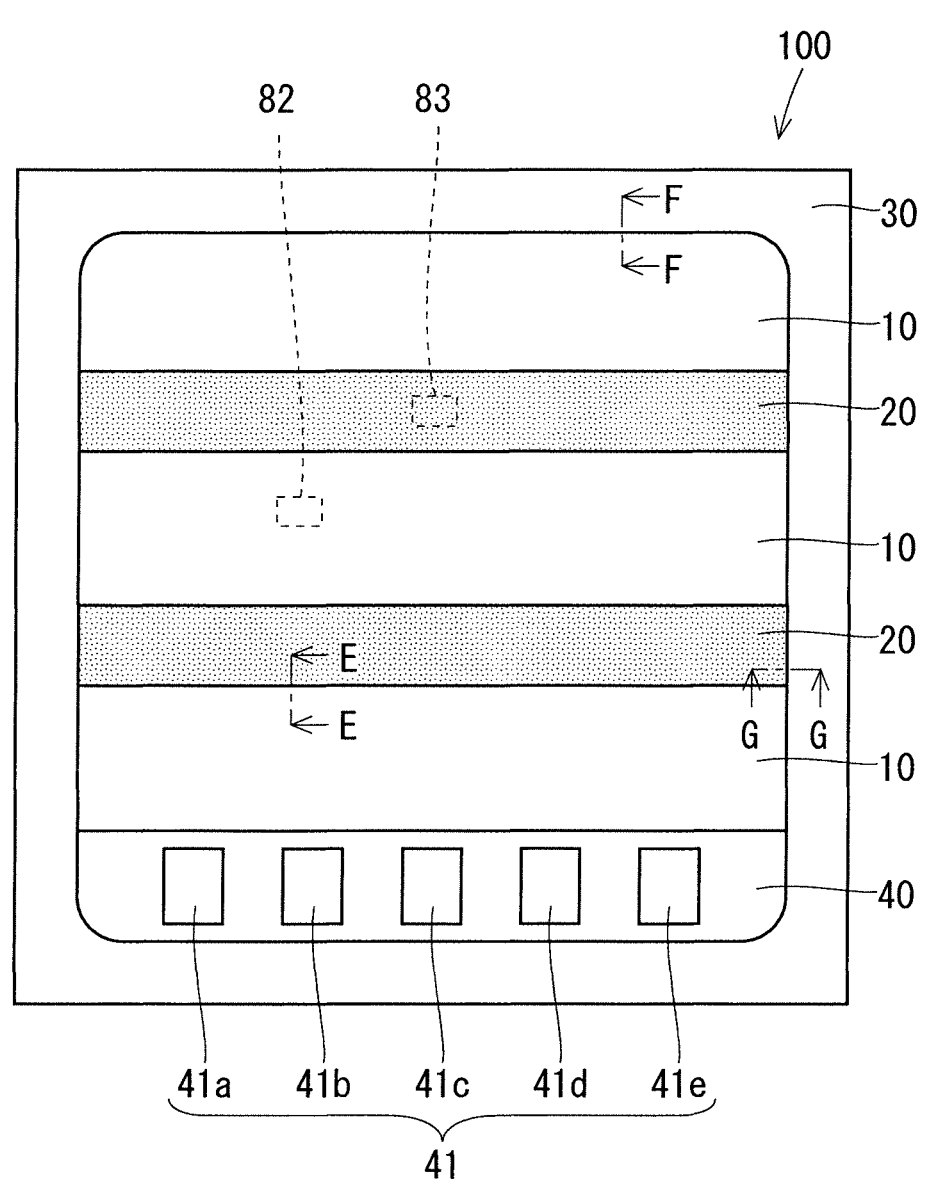

F I G.  2
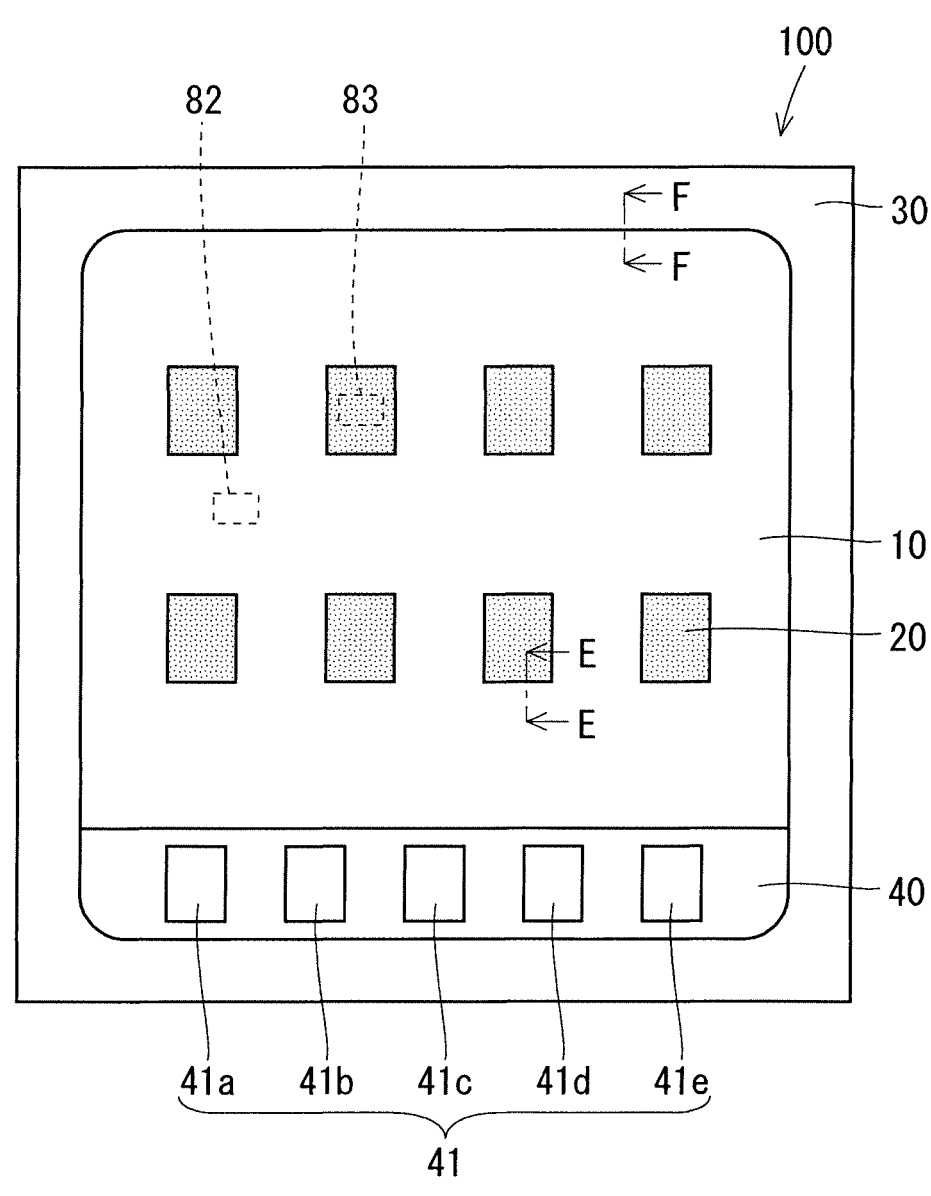

F I G.   3
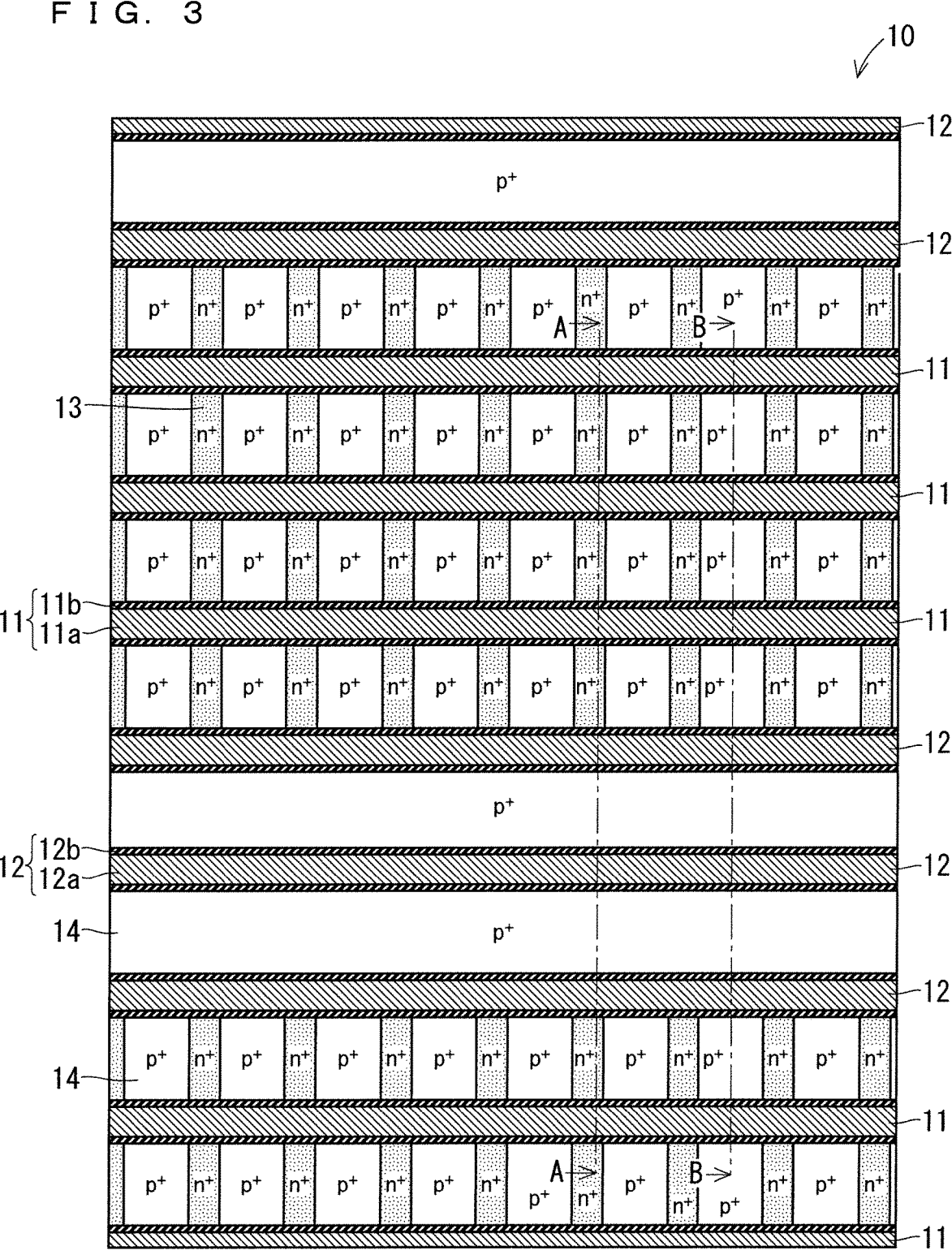

F I G.  4
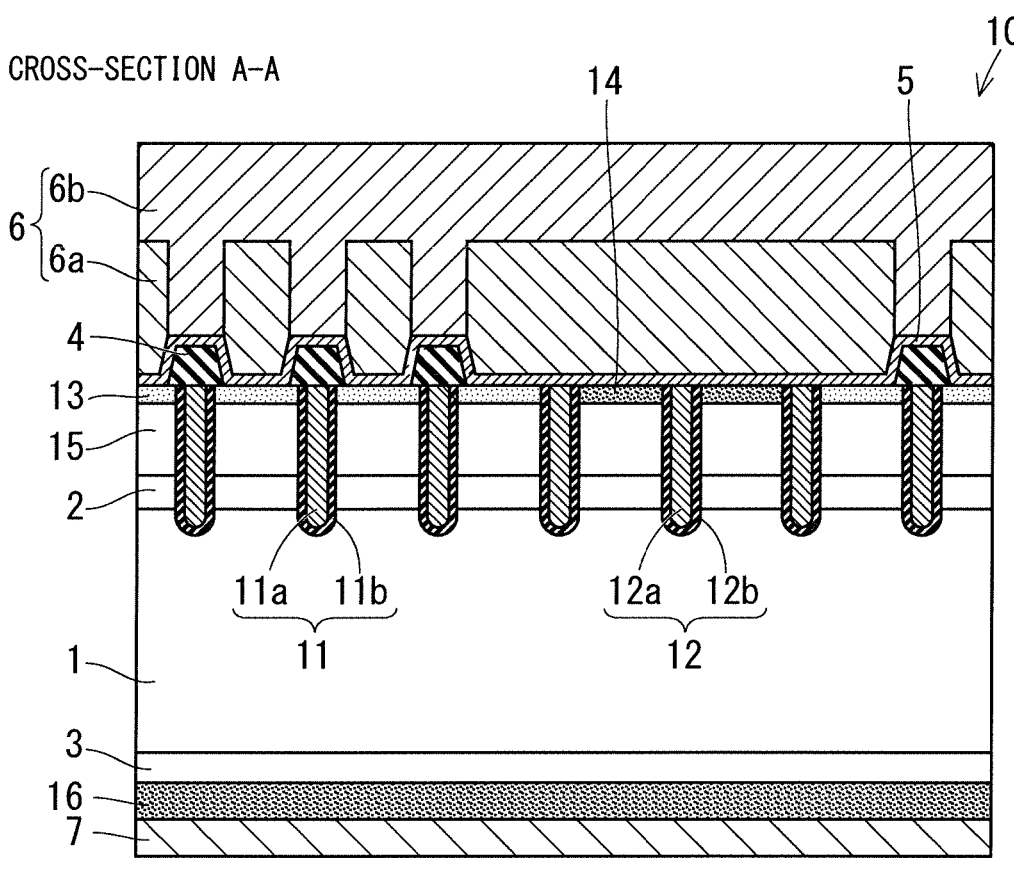

F I G. 5
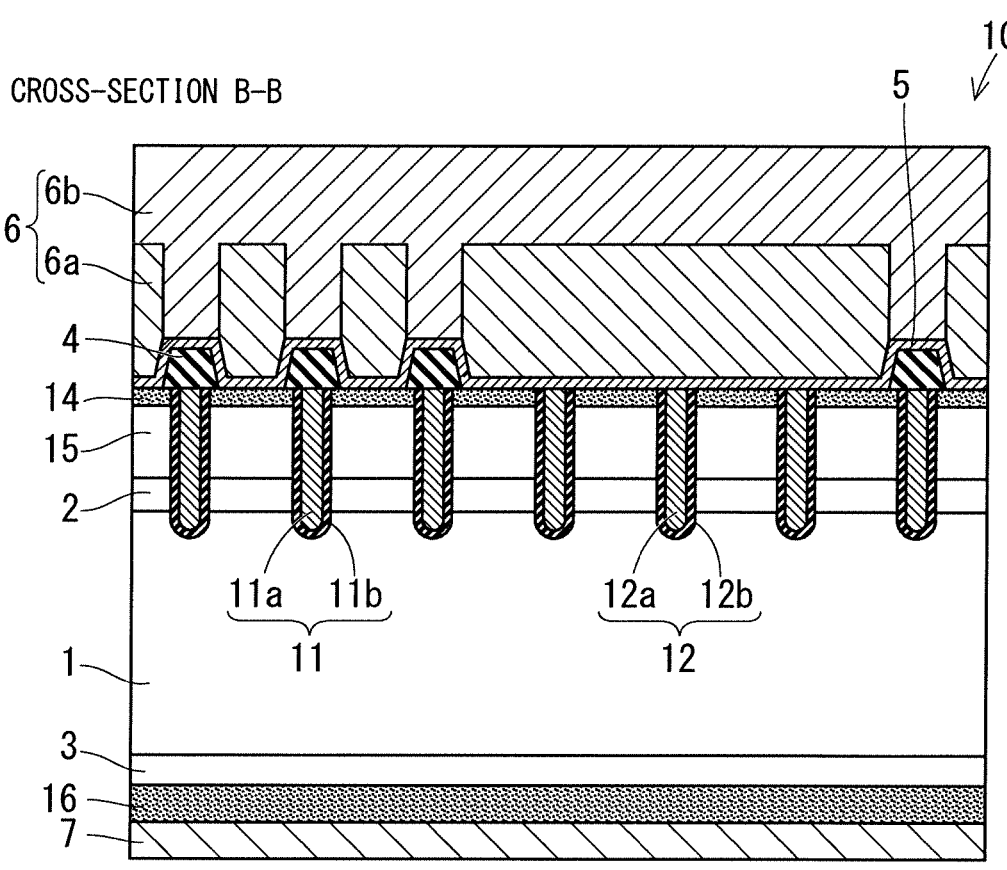

F I G.  6
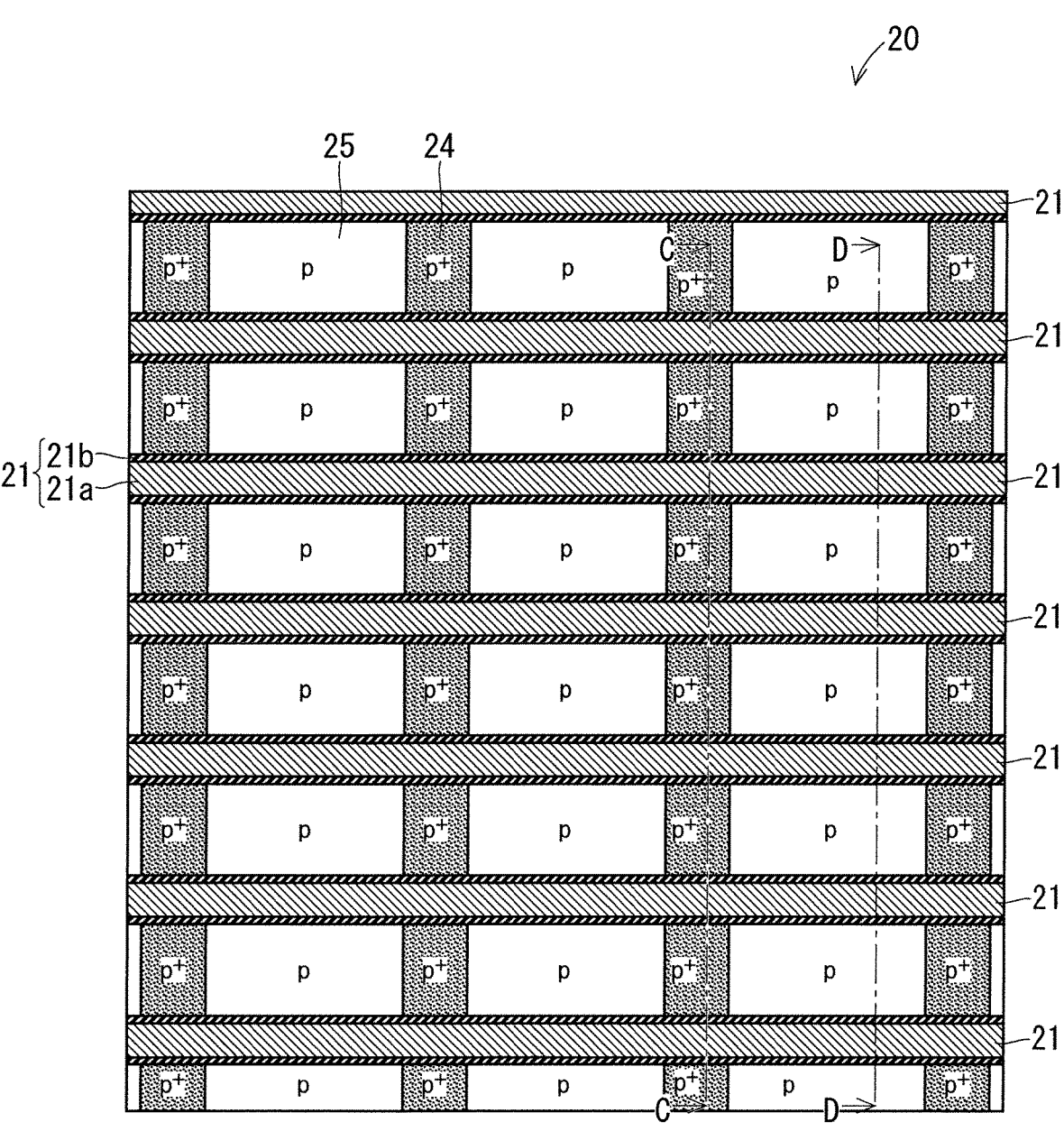

F I G.  7
CROSS-SECTION C-C
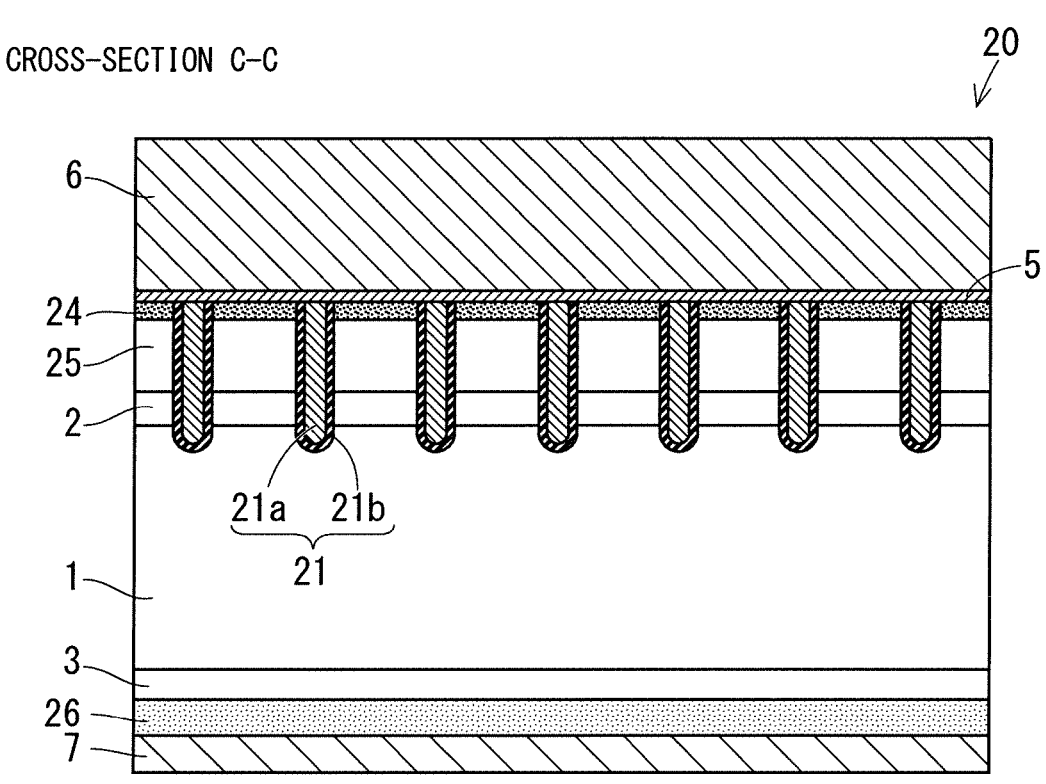

F I G. 8
CROSS-SECTION D-D
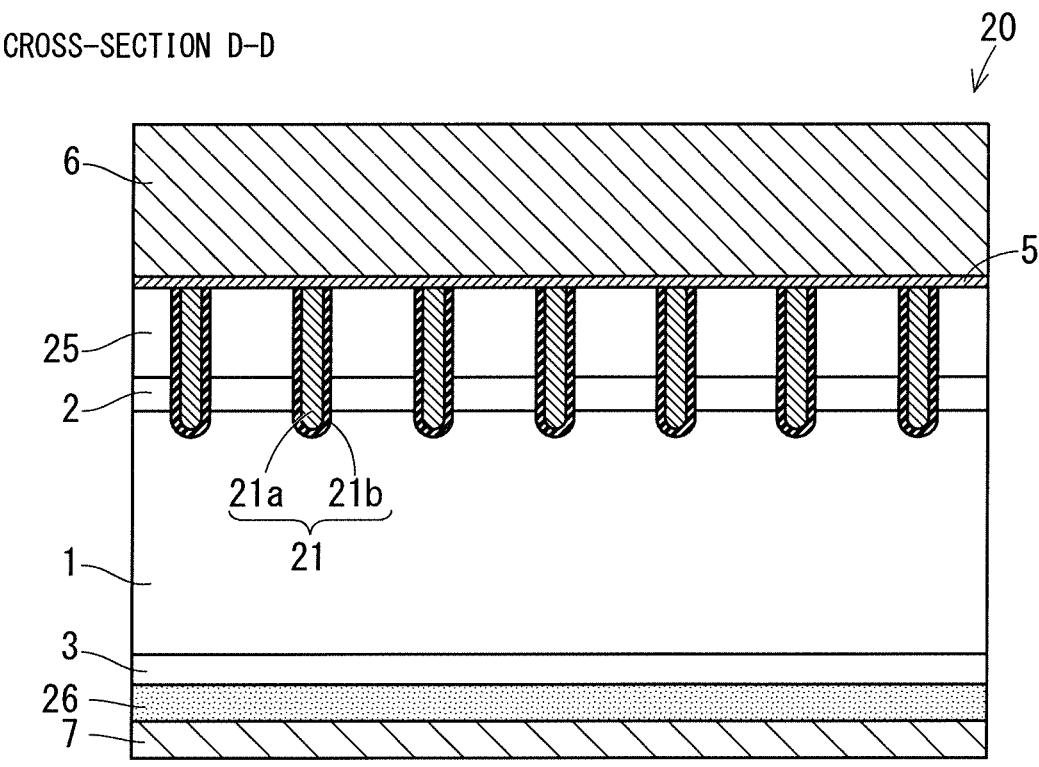

F I G.  9
CROSS-SECTION E-E
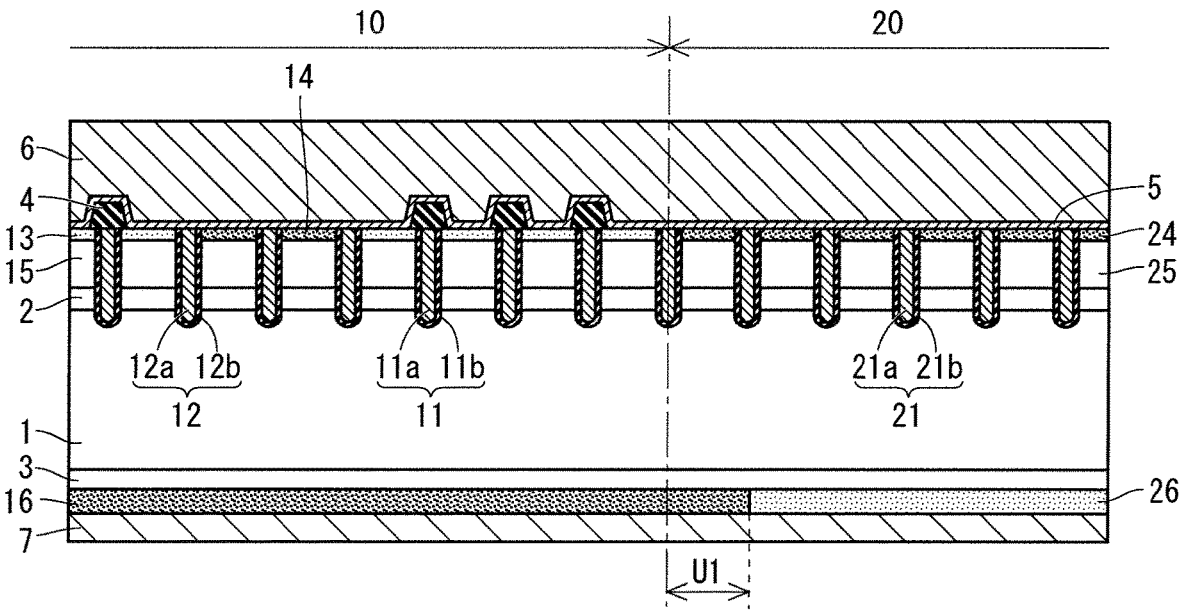

F I G.  1 1
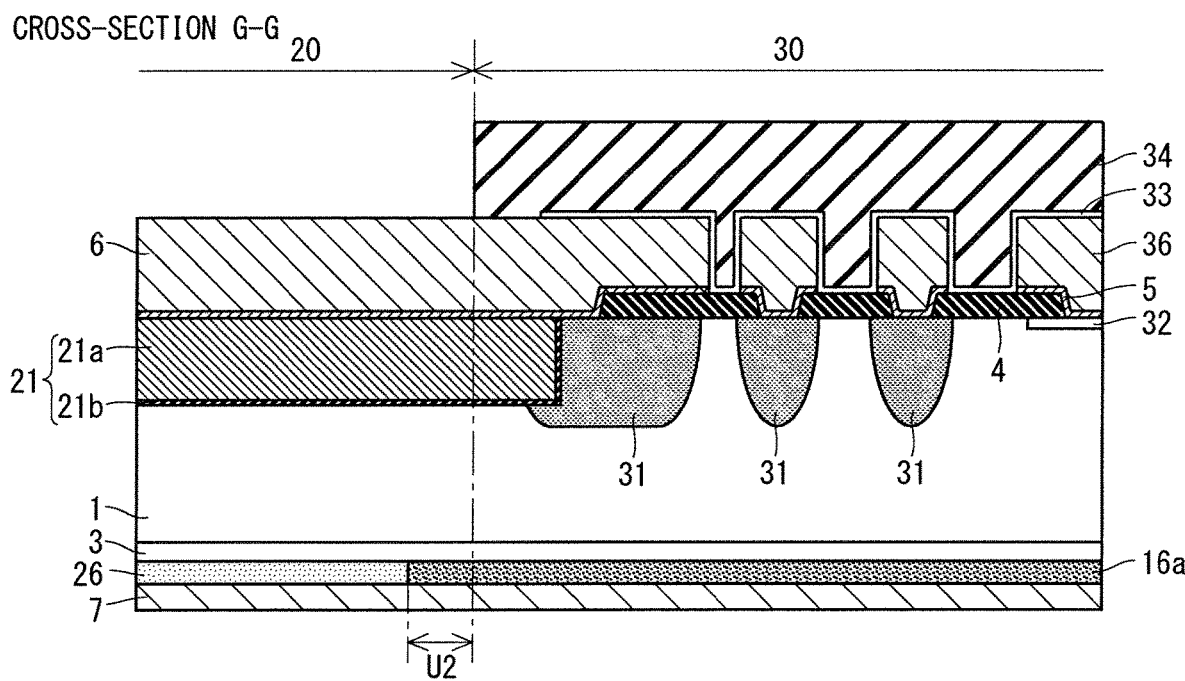

F I G .   1 2 A
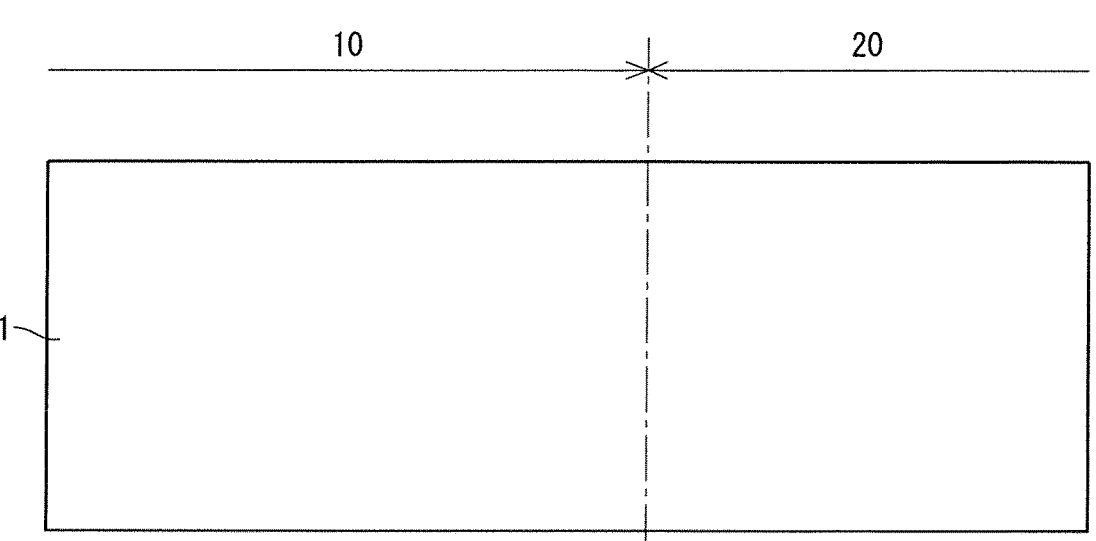
F I G .   1 2 B
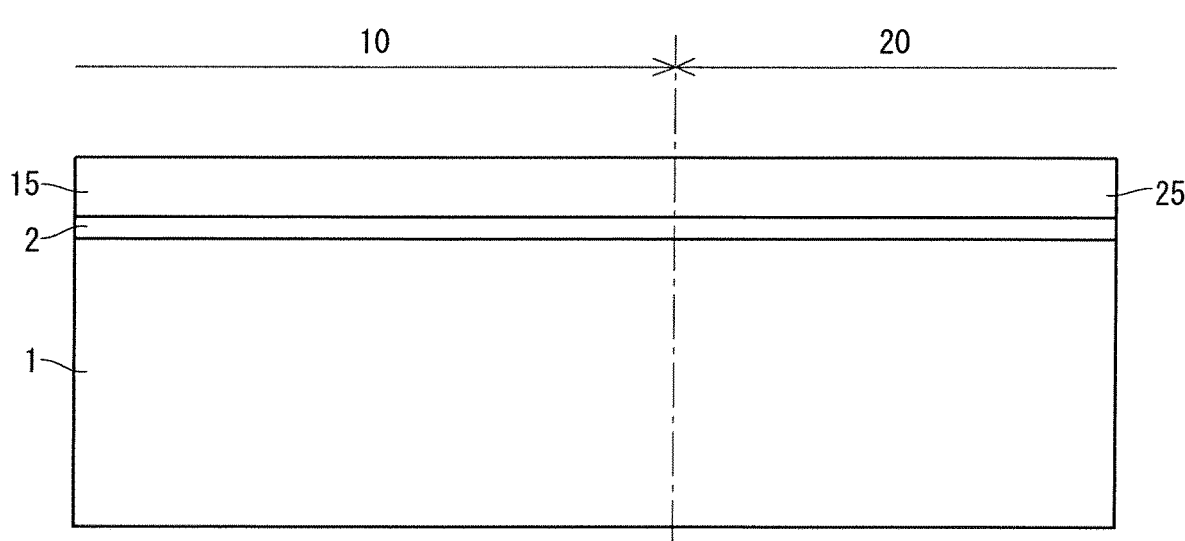

F I G.  1 3 A
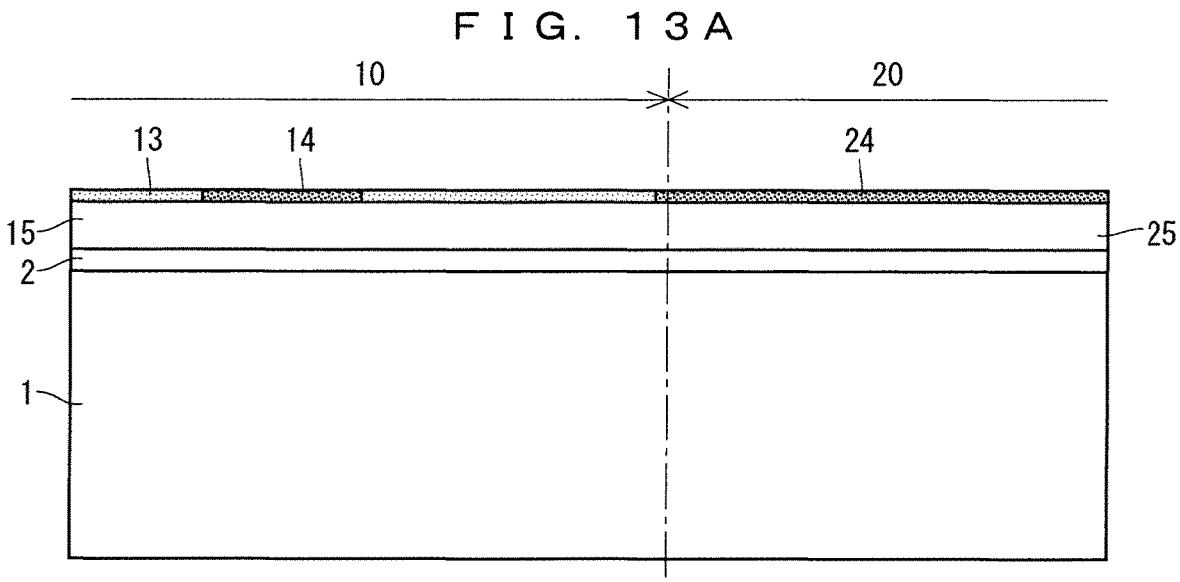
F I G.  1 3 B
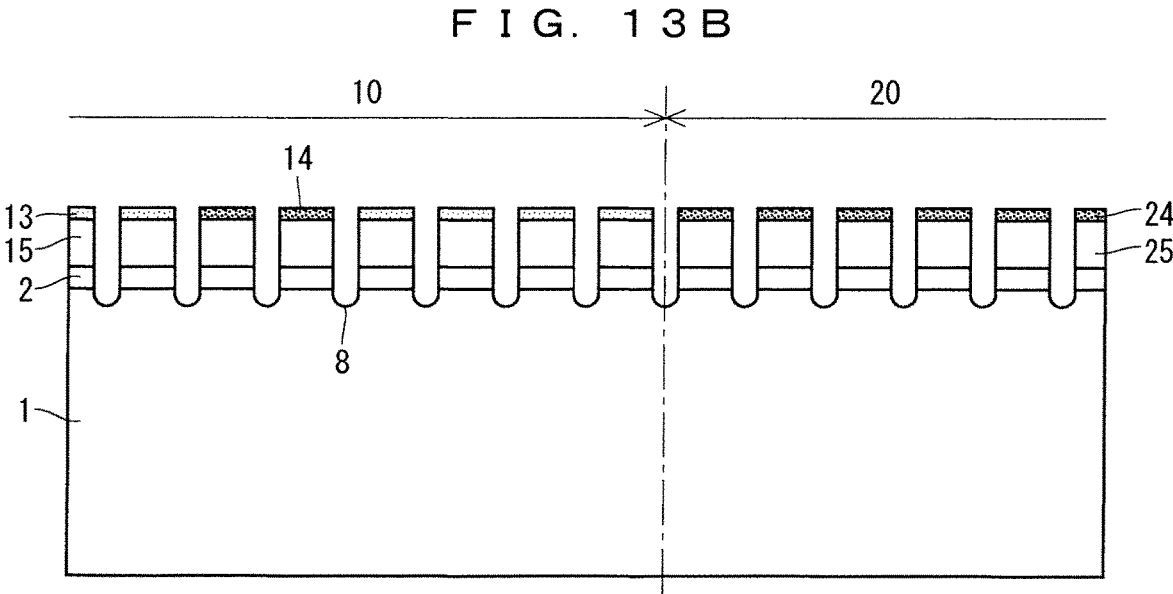

F I G .  1 4 A
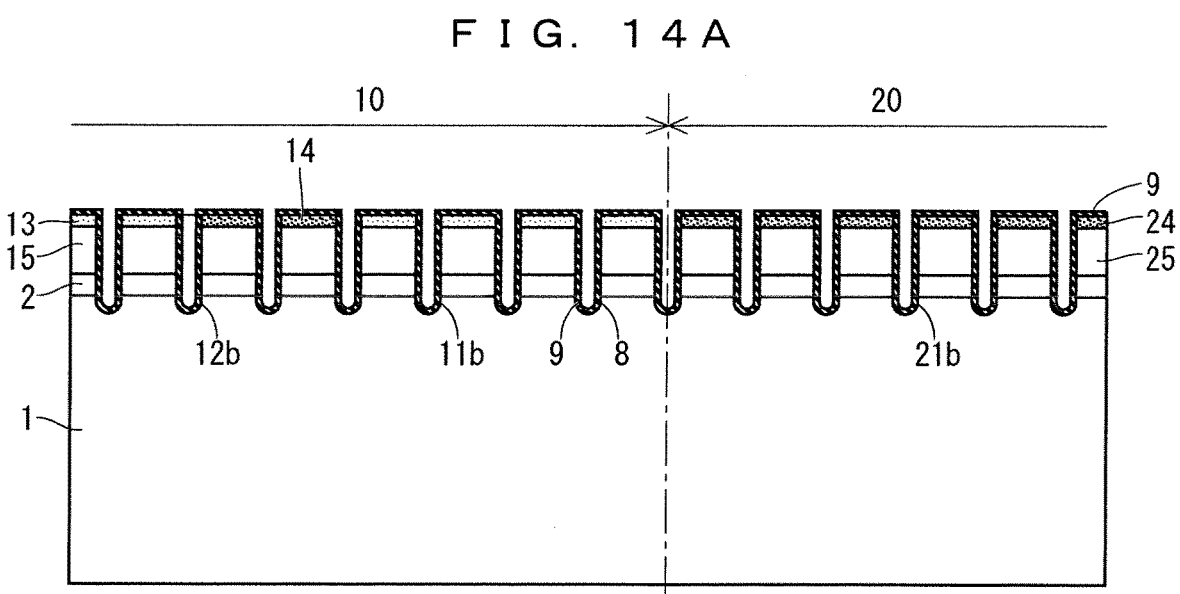
F I G .  1 4 B
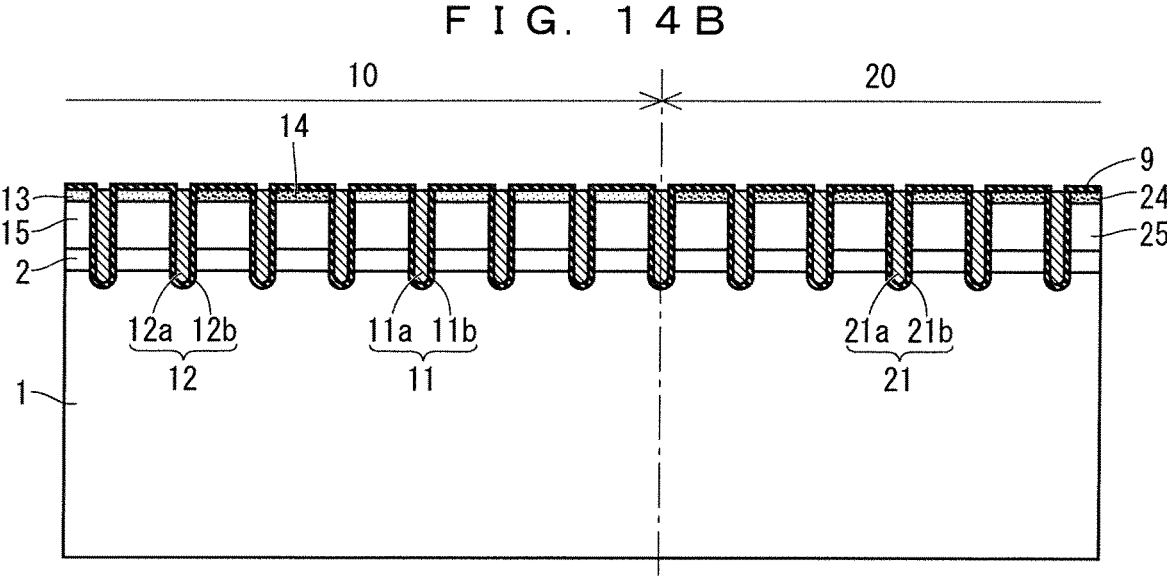

F I G   1 5 A
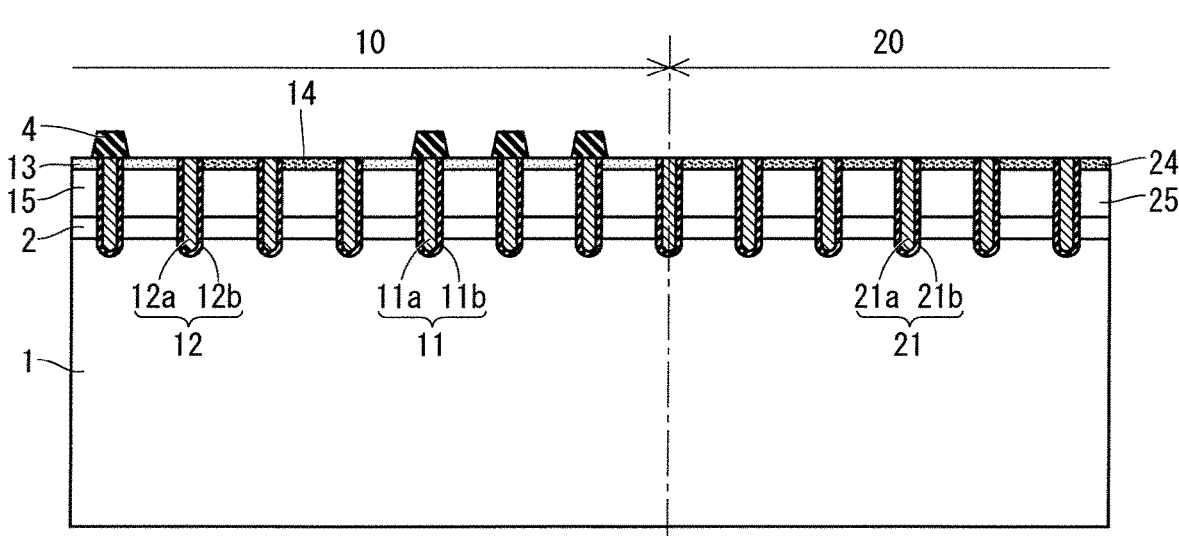
F I G.   1 5 B
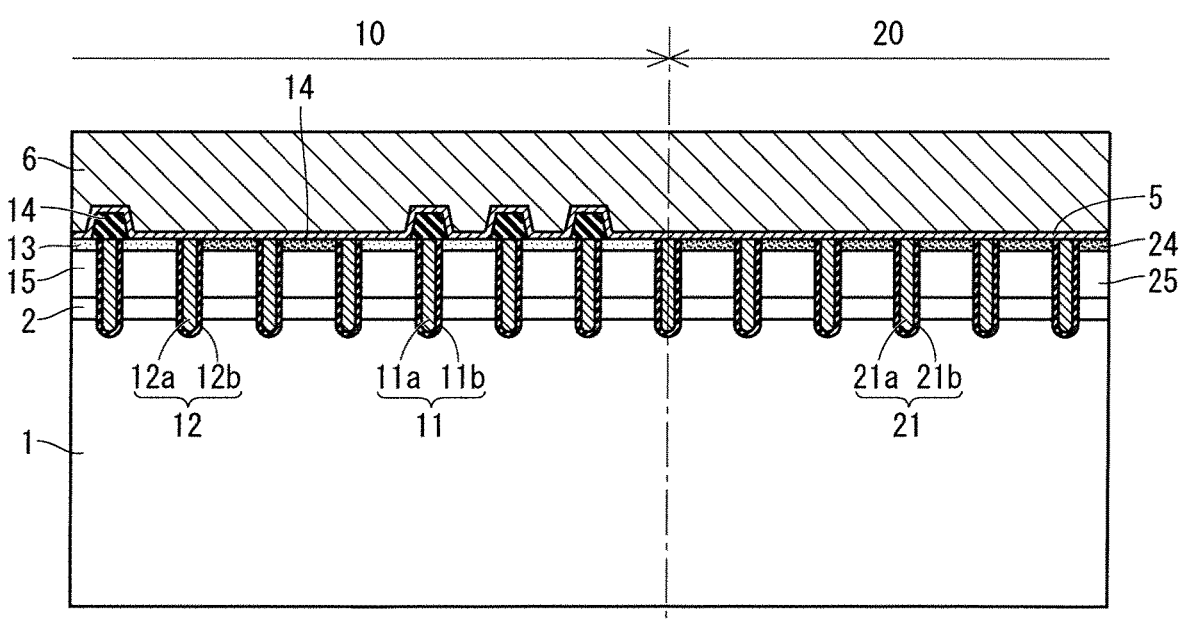

F I G.   1 7 A
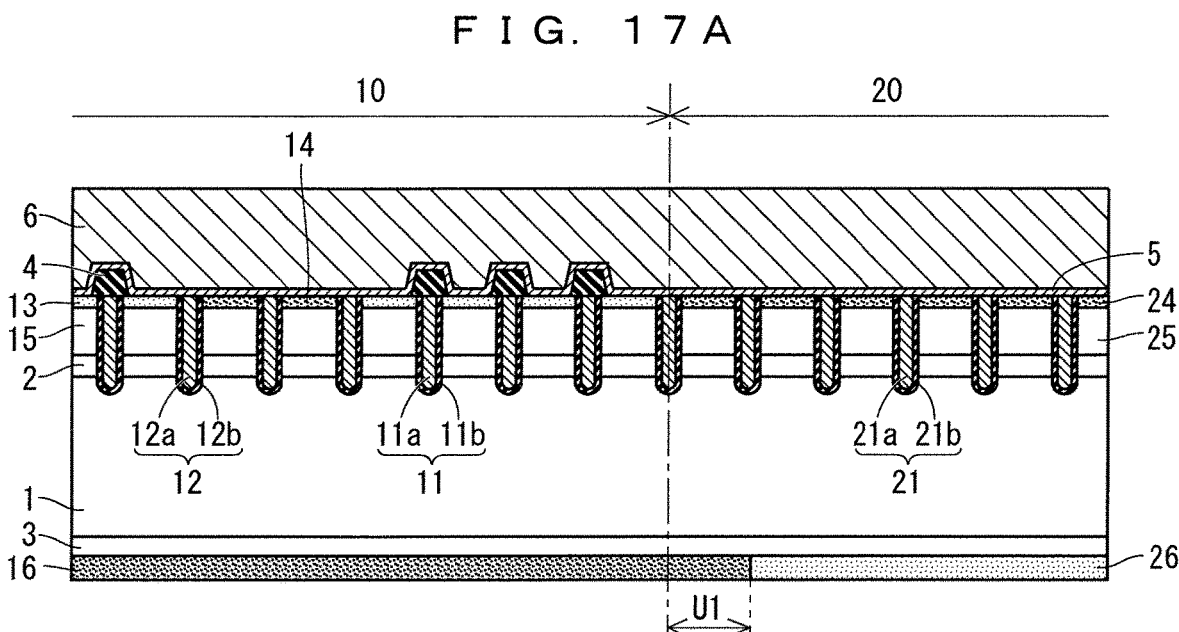
F I G.   1 7 B
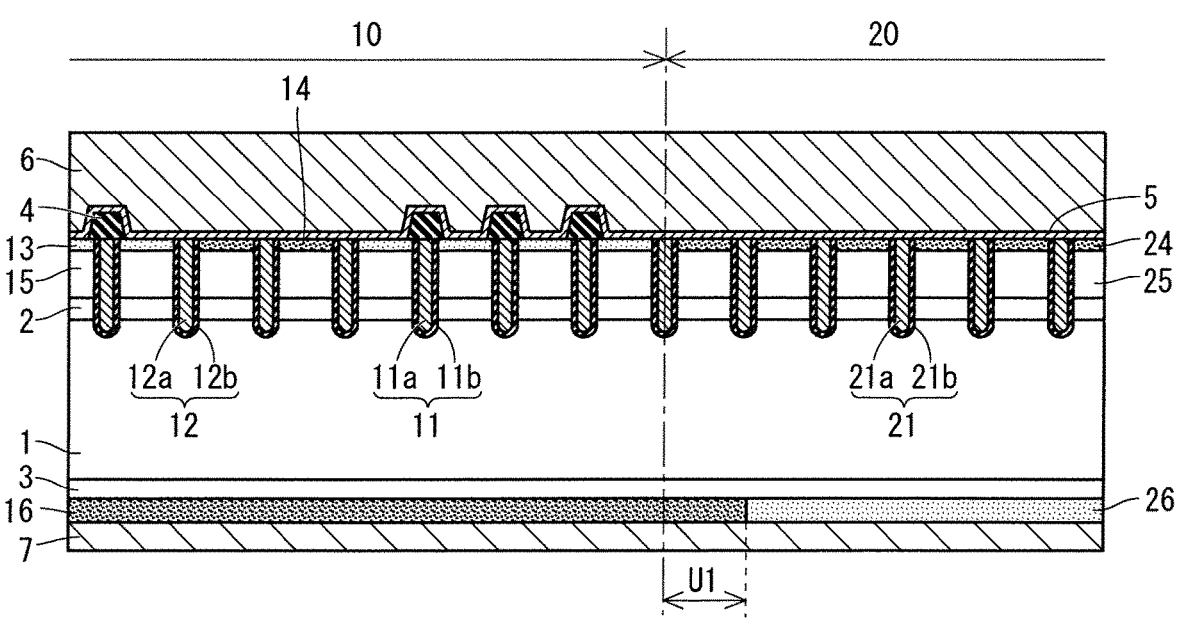

F I G. 1 8
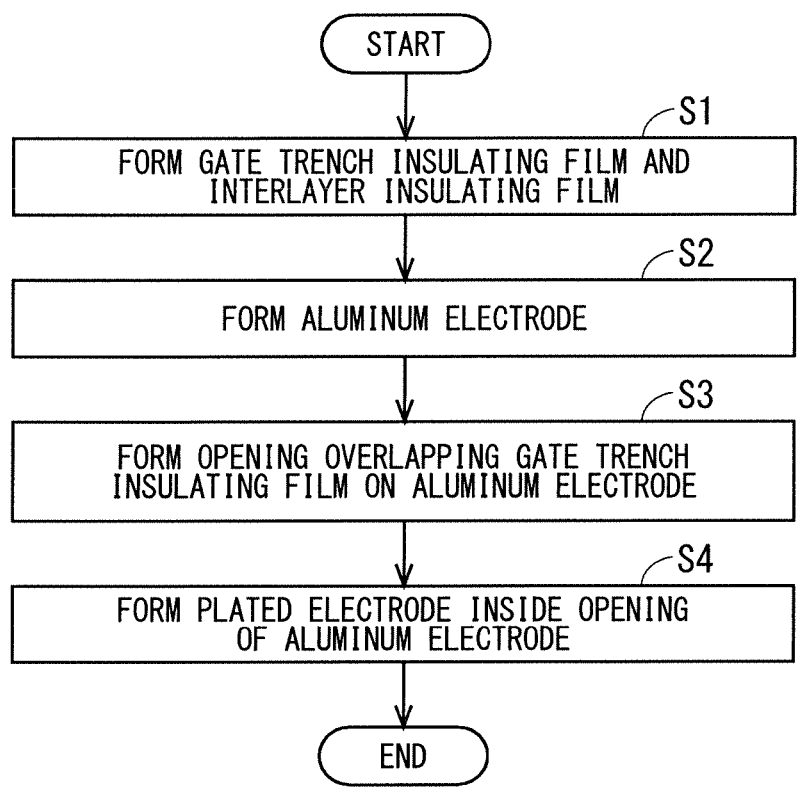

CROSS-SECTION H-H

F I G. 2 1
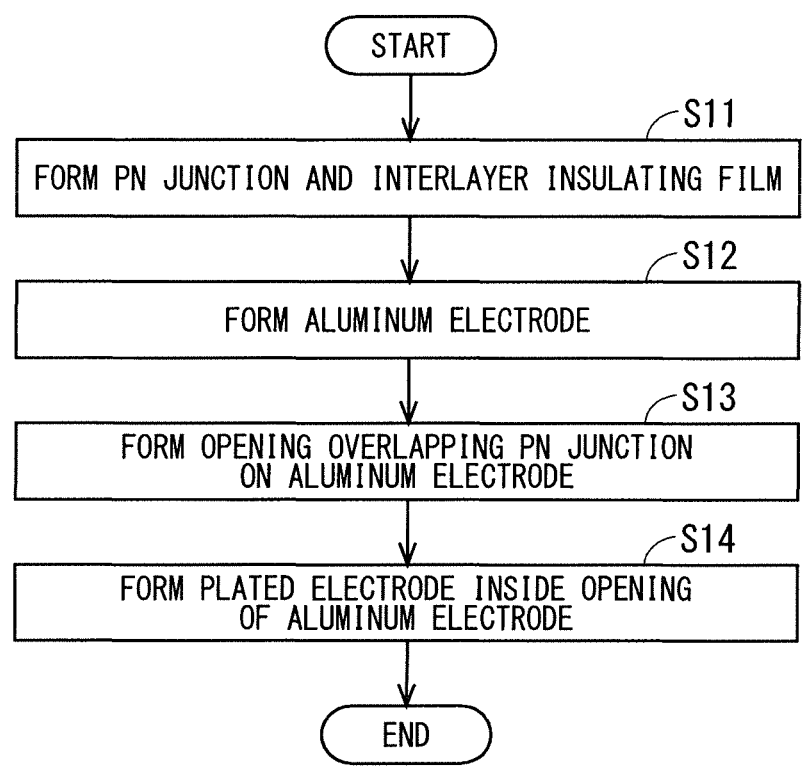

F I G.   2 2
CROSS-SECTION H-H
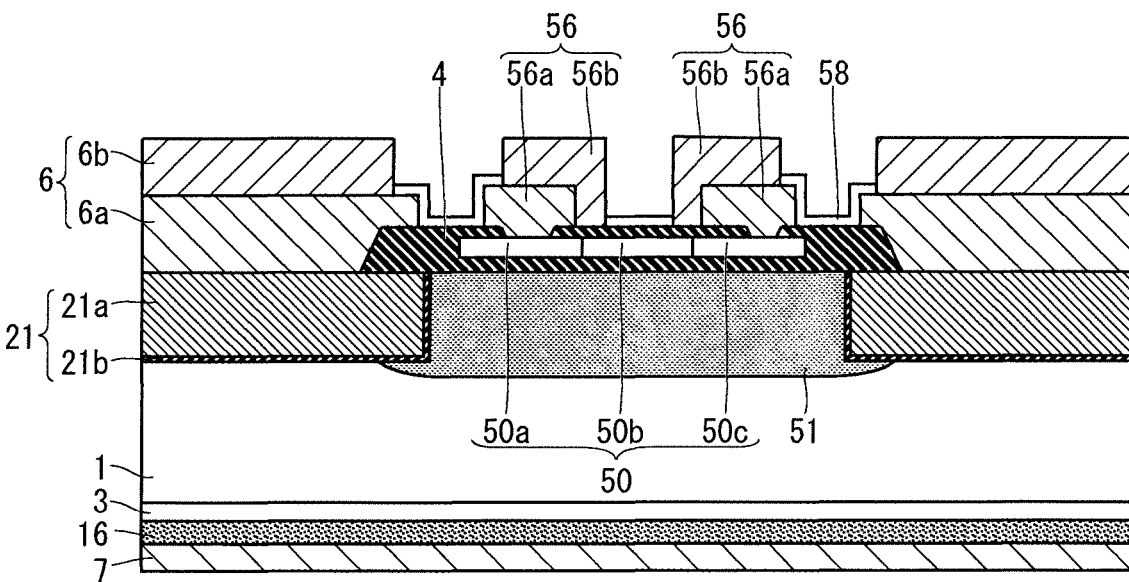

F I G .  2 3
CROSS-SECTION G-G
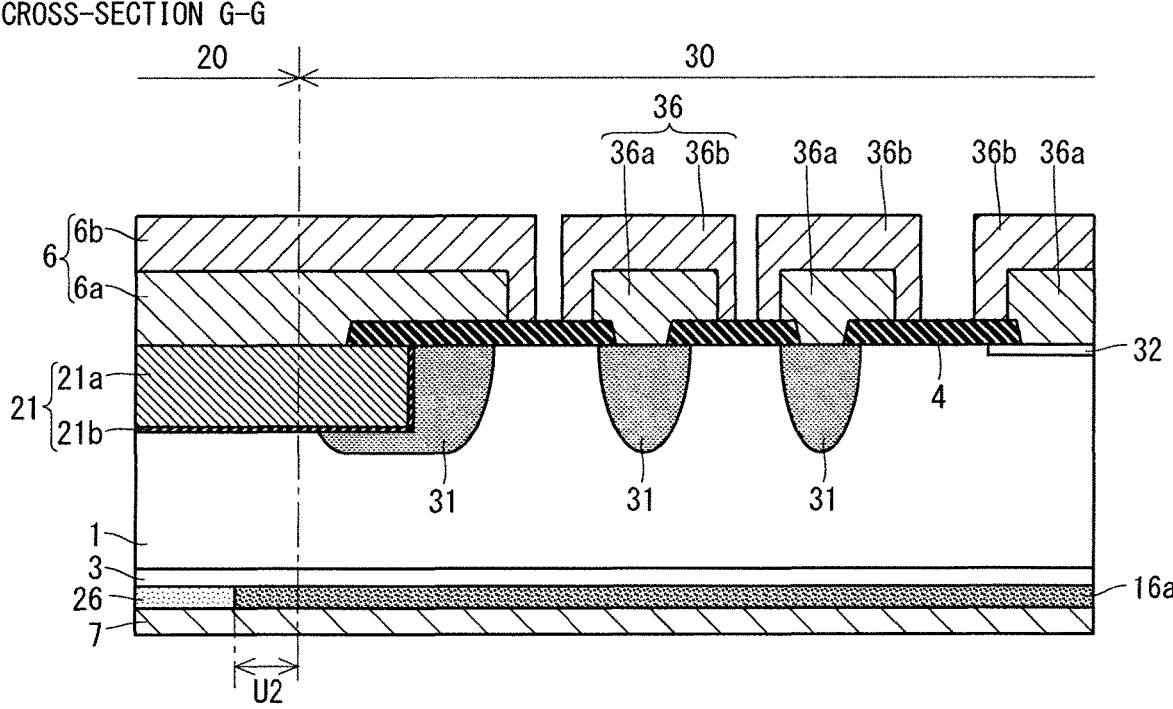

CROSS-SECTION G-G

F I G . 2 5
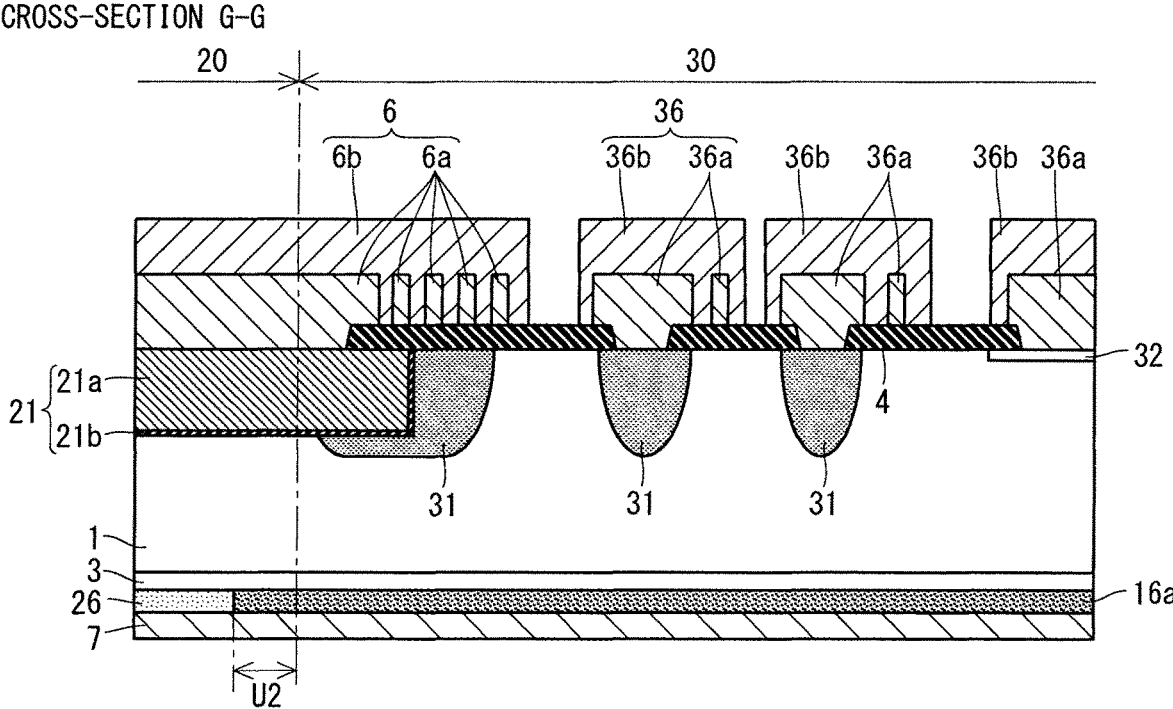
CROSS-SECTION G-G

CROSS-SECTION G-G

SEMICONDUCTOR DEVICE AND METHOD OF MANUFACTURING SEMICONDUCTOR DEVICE

BACKGROUND OF THE INVENTION

FIELD OF THE INVENTION

The present disclosure relates to a semiconductor device and a method of manufacturing the semiconductor device.

DESCRIPTION OF THE BACKGROUND ART

Semiconductor devices have been proposed in which an IGBT (Insulated Gate Bipolar Transistor) region and a diode region are provided on one semiconductor substrate. Among such semiconductor devices, there has been proposed a semiconductor device in which a barrier metal for preventing metal diffusion of electrode is omitted from an electrode of IGBT and an electrode of diode (for example, Japanese Patent Application Laid-Open No. 2022-56498).

In the semiconductor device in which the barrier metal is omitted as described above, a high-temperature heat treatment cannot be added after the formation of the electrode from the viewpoint of suppressing metal diffusion. Therefore, an energy level remains at an interface between silicon and an insulating film such as an oxide film and at a pn junction such as a grain boundary of polysilicon, resulting in a problem of unstable characteristics of the semiconductor device. In a case of a semiconductor device that is provided with a barrier metal, the same problem arises when the barrier metal does not have a sufficient function for reasons such as a small thickness of the barrier metal.

SUMMARY

The present disclosure has been made in view of the above-described problems, and an object thereof is to provide a technique capable of stabilizing characteristics of a semiconductor device.

The semiconductor device according to the present disclosure includes: a semiconductor substrate provided with a semiconductor portion which is at least one of a gate insulating film, a pn junction, or a drift layer of a terminal region; an insulating film provided on the semiconductor portion; a metal electrode having an opening that overlaps the semiconductor portion in plan view and is provided on a side opposite to the semiconductor portion with respect to the insulating film in cross-sectional view; and a plated electrode provided at at least a portion of an inside of the opening using the metal electrode as a material to be plated.

Characteristics of the semiconductor device can be stabilized.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view showing a configuration of a semiconductor device according to a first preferred embodiment;

FIG. 2 is a plan view showing another configuration of the semiconductor device according to the first preferred embodiment;

FIG. 3 is a partially enlarged plan view showing a configuration of an IGBT region of the semiconductor device according to the first preferred embodiment;

FIGS. 4 and 5 are cross-sectional views each showing the configuration of the IGBT region of the semiconductor device according to the first preferred embodiment;

FIG. 6 is a partially enlarged plan view showing a configuration of a diode region of the semiconductor device according to the first preferred embodiment;

FIGS. 7 and 8 are cross-sectional views each showing the configuration of the diode region of the semiconductor device according to the first preferred embodiment;

FIG. 9 is a cross-sectional view showing a configuration of a boundary region between the IGBT region and the diode region of the semiconductor device according to the first preferred embodiment;

FIGS. 10 and 11 are cross-sectional views each showing a configuration of a terminal region of the semiconductor device according to the first preferred embodiment;

FIGS. 12A to 17B are cross-sectional views each showing a method of manufacturing the semiconductor device according to the first preferred embodiment;

FIG. 18 is a flowchart showing a part of the method of manufacturing the semiconductor device according to the first preferred embodiment;

FIG. 21 is a flowchart showing a part of a method of manufacturing the semiconductor device according to the second preferred embodiment;

FIG. 22 is a cross-sectional view showing a configuration of a temperature sense diode region of a semiconductor device according to a third preferred embodiment;

FIG. 23 is a cross-sectional view showing a configuration of a terminal region of a semiconductor device according to a fourth preferred embodiment;

FIG. 25 is a cross-sectional view showing a configuration of a terminal region of a semiconductor device according to a sixth preferred embodiment.

DESCRIPTION OF THE PREFERRED EMBODIMENTS

Figure 10:
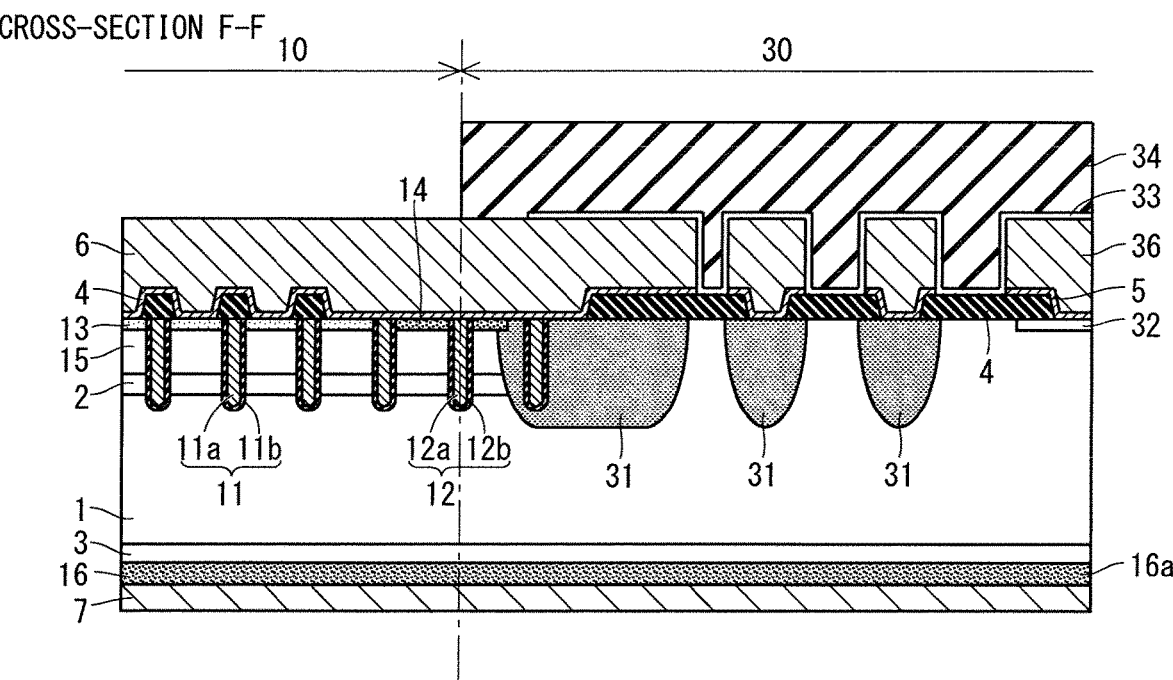

Hereinafter, preferred embodiments will be described with reference to the accompanying drawings. The features described in the following preferred embodiments are examples, and all the features are not necessarily indispensable. In the following description, the same components are denoted by the same or similar reference signs in a plurality of preferred embodiments, and different components will be mainly described. In addition, in the following description, specific positions and directions such as "upper", "lower", "left", "right", "front", and "back" do not necessarily match positions and directions in actual implementation. The fact that a certain portion has a higher density than another portion indicates that, for example, the average density of the certain portion is higher than the average density of the another portion. Conversely, the fact that a certain portion has a lower density than another portion indicates that, for example, the average density of the certain portion is lower than the average density of the another portion. In the following description, the first conductivity type is the n-type and the second conductivity type is the p-type, but the first conductivity type may be the p-type and the second conductivity type may be the n-type. Further, $n^-$ indicates that the impurity concentration is lower than n, and $n^+$ indicates that the impurity concentration is higher than n. Similarly, $p^-$ indicates that the impurity concentration is lower than p, and $p^+$ indicates that the impurity concentration is higher than p.

First Preferred Embodiment

FIG. 1 is a plan view showing a semiconductor device which is an RC-IGBT (Reverse Conducting IGBT). FIG. 2 is a plan view showing another configuration of the semiconductor device which is the RC-IGBT according to the first preferred embodiment. In a semiconductor device 100 shown in FIG. 1, IGBT regions 10 and diode regions 20 are provided side by side in a stripe shape, and the semiconductor device 100 may be simply referred to as a "stripe type" in the following description. In the semiconductor device 100 shown in FIG. 2, a plurality of diode regions 20 are provided in a vertical direction and a horizontal direction, and the IGBT region 10 is provided around the diode regions 20, and in the following description, the semiconductor device 100 may be simply referred to as an "island type".

<Overall Planar Structure of Stripe Type>

In FIG. 1, the semiconductor device 100 includes the IGBT regions 10 and the diode regions 20 in one semiconductor device. Each of the IGBT region 10 and the diode region 20 extends from one end side to the other end side of the semiconductor device 100, and is alternately provided in a stripe shape in a direction orthogonal to the extending direction of the IGBT region 10 and the diode region 20. FIG. 1 shows three IGBT regions 10 and two diode regions 20, and shows a configuration in which all the diode regions 20 are sandwiched between the IGBT regions 10. However, the numbers of the IGBT regions 10 and the diode regions 20 are not limited thereto, and the number of the IGBT regions 10 may be three or more or three or less, and the number of the diode regions 20 may be two or more or two or less. Further, the positions of the IGBT regions and the diode regions 20 of FIG. 1 may be switched, or all the IGBT regions 10 may be sandwiched between the diode regions 20. Alternatively, each of the IGBT regions 10 may be respectively provided adjacent to each of the diode regions 20.

As shown in FIG. 1, a pad region 40 is provided adjacent to the lower side of the IGBT region 10 in the drawing. The pad region 40 is a region where a control pad 41 for controlling the semiconductor device 100 is provided. In the following description, the IGBT region 10 and the diode region 20 may be collectively referred to as a cell region. A terminal region 30 is provided around the region combining the cell region and the pad region 40 in order to maintain the withstand voltage of the semiconductor device 100. A well-known withstand voltage maintaining structure may be appropriately provided in the terminal region 30. In the withstand voltage maintaining structure, for example, an FLR (Field Limiting Ring) in which the cell region is surrounded by a p-type terminal well layer of a p-type semiconductor or a VLD (Variation of Lateral Doping) in which the cell region is surrounded by a p-type well layer having a concentration gradient may be provided on a first main surface side which is the front surface side of the semiconductor device 100. The number of the ring-shaped p-type terminal well layers used for the FLR and the concentration distribution used for the VLD may be appropriately selected depending on the withstand voltage design of the semiconductor device 100. Further, the p-type terminal well layers may be provided over substantially the entire region of the pad region 40, and an IGBT cell or a diode cell may be provided in the pad region 40.

The control pad 41 includes, for example, at least one of a current sense pad 41a, a Kelvin-emitter pad 41b, a gate pad 41c, or temperature sense diode pads 41d, 41e.

The current sense pad 41a is a control pad for detecting a current flowing through the cell region of the semiconductor device 100. The current sense pad 41a is electrically connected to the cell region so that when a current flows to the cell region of the semiconductor device 100, a fraction to one several ten-thousandth of the current flowing through the entire cell region flows to a part of the IGBT cells or diode cells of the cell region.

The Kelvin-emitter pad 41b and the gate pad 41c are control pads to which a gate drive voltage is applied for on-off control of the semiconductor device 100. The Kelvin-emitter pad 41b is electrically connected to a p-type base layer of the IGBT cell. The gate pad 41c is electrically connected to a gate trench electrode of the IGBT cell. The Kelvin-emitter pad 41b and the p-type base layer may be electrically connected to each other via a $p^+$-type contact layer. The temperature sense diode pads 41d, 41e are control pads electrically connected to an anode and a cathode of a temperature sense diode provided in the semiconductor device 100. A voltage between the anode and the cathode of the unillustrated temperature sense diode provided in the cell region is measured via the temperature sense diode pads 41d, 41e, and the temperature of the semiconductor device 100 is measured based on the voltage.

<Overall Planar Structure of Island Type>

In FIG. 2, the semiconductor device 100 includes the IGBT region 10 and the diode regions 20 in one semiconductor device. A plurality of diode regions 20 are arranged side by side in each of the vertical direction and the horizontal direction in the semiconductor device 100, and the peripheries of the diode regions 20 are surrounded by the IGBT region 10. That is, a plurality of diode regions 20 are provided in an island shape in the IGBT region 10. FIG. 2 shows a configuration in which the diode regions 20 are provided in a matrix form of four columns in the horizontal direction of the drawing and two rows in the vertical direction of the drawing. However, the number and arrangement of the diode regions 20 are not limited thereto, and it is sufficient that one or a plurality of diode regions 20 are provided in a scattered manner in the IGBT region 10 and the periphery of each diode region 20 is surrounded by the IGBT region 10.

As shown in FIG. 2, the pad region 40 is provided adjacent to the lower side of the IGBT region 10 in the drawing. The pad region 40 is a region where the control pad 41 for controlling the semiconductor device 100 is provided. In the description here, the IGBT region 10 and the diode region 20 are also collectively referred to as a cell region. The terminal region 30 is provided around the region combining the cell region and the pad region 40 in order to maintain the withstand voltage of the semiconductor device 100. A well-known withstand voltage maintaining structure may be appropriately provided in the terminal region 30. In the withstand voltage maintaining structure, for example, the FLR in which the region combining the cell region and the pad region 40 is surrounded by the p-type terminal well layer of the p-type semiconductor or the VLD in which the cell region is surrounded by the p-type well layer having the concentration gradient may be provided on the first main surface side which is the front surface side of the semiconductor device 100. The number of the ring-shaped p-type terminal well layers used for the FLR and the concentration distribution used for the VLD may be appropriately selected depending on the withstand voltage design of the semiconductor device 100. Further, the p-type terminal well layers may be provided over substantially the entire region of the pad region 40, and the IGBT cell or the diode cell may be provided in the pad region 40.

The control pad 41 includes, for example, at least one of the current sense pad 41a, the Kelvin-emitter pad 41b, the gate pad 41c, or the temperature sense diode pads 41d, 41e.

The current sense pad 41a is a control pad for detecting a current flowing through the cell region of the semiconductor device 100. The current sense pad 41a is electrically connected to the cell region so that when a current flows to the cell region of the semiconductor device 100, a fraction to one several ten-thousandth of the current flowing through the entire cell region flows to a part of the IGBT cells or diode cells of the cell region.

The Kelvin-emitter pad 41b and the gate pad 41c are control pads to which a gate drive voltage is applied for on-off control of the semiconductor device 100. The Kelvin-emitter pad 41b is electrically connected to a p-type base layer and a $n^+$-type source layer of the IGBT cell. The gate pad 41c is electrically connected to the gate trench electrode of the IGBT cell. The Kelvin-emitter pad 41b and the p-type base layer may be electrically connected to each other via the $p^+$-type contact layer. The temperature sense diode pads 41d, 41e are control pads electrically connected to the anode and the cathode of the temperature sense diode provided in the semiconductor device 100. A voltage between the anode and the cathode of the unillustrated temperature sense diode provided in the cell region is measured via the temperature sense diode pads 41d, 41e, and the temperature of the semiconductor device 100 is measured based on the voltage.

<IGBT Region 10>

FIG. 3 is a partially enlarged plan view showing a configuration of the IGBT region 10 of the semiconductor device which is an RC-IGBT. Specifically, FIG. 3 is an enlarged view of a region surrounded by a broken line 82 in the semiconductor device 100 shown in FIGS. 1 and 2.

FIGS. 4 and 5 are cross-sectional views each showing the configuration of the IGBT region 10 of the semiconductor device which is an RC-IGBT. Specifically, FIG. 4 is a cross-sectional view of the semiconductor device 100 taken along a dash-dotted line A-A shown in FIG. 3, and FIG. 5 is a cross-sectional view of the semiconductor device 100 taken along a dash-dotted line B-B shown in FIG. 3.

As shown in FIG. 3, an active trench gate 11 and a dummy trench gate 12 are provided in a stripe shape in the IGBT region 10. In the semiconductor device 100 of FIG. 1, the active trench gate 11 and the dummy trench gate 12 extend in the longitudinal direction of the IGBT region 10, and the longitudinal direction of the IGBT region 10 corresponds to the longitudinal direction of the active trench gate 11 and the dummy trench gate 12. On the other hand, in the semiconductor device 100 of FIG. 2, there is no particular distinction between the longitudinal direction and the lateral direction in the IGBT region 10, and the horizontal direction in the drawing may correspond to the longitudinal direction of the active trench gate 11 and the dummy trench gate 12, or the vertical direction in the drawing may correspond to the longitudinal direction of the active trench gate 11 and the dummy trench gate 12.

The active trench gate 11 is configured by providing a gate trench electrode 11a in a trench of a semiconductor substrate with a gate trench insulating film 11b which is a gate insulating film therebetween. The gate trench insulating film 11b is included in a semiconductor portion. For example, an oxide film is used as the gate trench insulating film 11b. The dummy trench gate 12 is configured by providing a dummy trench electrode 12a in a trench of the semiconductor substrate with a dummy trench insulating film 12b therebetween. The gate trench electrode 11a of the active trench gate 11 is electrically connected to the gate pad 41c of FIGS. 1 and 2. The dummy trench electrode 12a of the dummy trench gate 12 is electrically connected to an emitter electrode provided on the first main surface of the semiconductor device 100.

As shown in FIG. 3, an $n^+$-type source layer 13 is provided in contact with the gate trench insulating film 11b on both sides in the widthwise direction of the active trench gate 11. The $n^+$-type source layer 13 is a semiconductor layer containing, for example, arsenic or phosphorus as an n-type impurity, and the concentration of the n-type impurity is, for example, $1.0 \text{ E+17/cm}^3$ to $1.0 \text{ E+20/cm}^3$ inclusive. The $n^+$-type source layer 13 and the $p^+$-type contact layer 14 are alternately provided along the extending direction of the active trench gate 11. The $p^+$-type contact layer 14 is provided in contact with the dummy trench insulating film 12b between two adjacent dummy trench gates 12. The $p^+$-type contact layer 14 is a semiconductor layer containing, for example, boron or aluminum as a p-type impurity, and the concentration of the p-type impurity is, for example, $1.0 \text{ E+15/cm}^3$ to $1.0 \text{ E+20/cm}^3$ inclusive.

As shown in FIG. 3, in the IGBT region 10 of the semiconductor device 100, three dummy trench gates 12 are arranged next to three arranged active trench gates 11. Next to the three arranged dummy trench gates 12, another three active trench gates 11 different from those described above are arranged. The IGBT region 10 has a configuration in which a set of the active trench gates 11 and a set of the dummy trench gates 12 are alternately arranged in this manner. Although the number of the active trench gates 11 included in one set of active trench gates 11 is three in FIG. 3, the number may be one or more. In addition, the number of the dummy trench gates 12 included in one set of dummy trench gates 12 may be one or more, and the number of the dummy trench gates 12 may be zero. That is, all the trench gates provided in the IGBT region 10 may be the active trench gates 11.

FIG. 4 is the cross-sectional view of the semiconductor device 100 taken along the dash-dotted line A-A in FIG. 3, and is the cross-sectional view of the IGBT region 10. The semiconductor device 100 includes an $n^-$-type drift layer 1 formed of a semiconductor substrate. The $n^-$-type drift layer 1 is a semiconductor layer containing, for example, arsenic or phosphorus as an n-type impurity, and the concentration of the n-type impurity is, for example, $1.0 \text{ E+12/cm}^3$ to $1.0 \text{ E+15/cm}^3$ inclusive. The concentration of the n-type impurity in the $n^+$-type source layer 13 described above is higher than the concentration of the n-type impurity in the $n^-$-type drift layer 1.

In FIG. 4, the range of the semiconductor substrate is from the $n^+$-type source layer 13 and the $p^+$-type contact layer 14 to the p-type collector layer 16. In FIG. 4, the upper ends of the $n^+$-type source layer 13 and the $p^+$-type contact layer 14 in the drawing are referred to as a first main surface of the semiconductor substrate, and the lower end of the p-type collector layer 16 in the drawing is referred to as a second main surface of the semiconductor substrate. The first main surface of the semiconductor substrate is a main surface on the front surface side of the semiconductor device 100, and the second main surface of the semiconductor substrate is a main surface on the back surface side of the semiconductor device 100. The semiconductor device 100 has an n⁻-type drift layer 1 between the first main surface and the second main surface opposed to the first main surface in the IGBT region 10 of the cell region. The semiconductor substrate may include, for example, at least one of a wafer or an epitaxial growth layer. The semiconductor substrate may include a wide bandgap semiconductor (silicon carbide (SiC), gallium nitride (GaN), or diamond) capable of stable operation at a high temperature.

As shown in FIG. 4, in the IGBT region 10, an n-type carrier storage layer 2 having a higher n-type impurity concentration than the n⁻-type drift layer 1 is provided on the first main surface side of the n⁻-type drift layer 1. The n-type carrier storage layer 2 is a semiconductor layer containing, for example, arsenic or phosphorus as an n-type impurity, and the concentration of the n-type impurity is, for example, 1.0 E+13/cm³ to 1.0 E+17/cm³ inclusive. The semiconductor device 100 may have a configuration in which the n-type carrier storage layer 2 is not provided and the n⁻-type drift layer 1 is also provided in the region of the n-type carrier storage layer 2 shown in FIG. 4. By providing the n-type carrier storage layer 2, it is possible to reduce conduction loss when a current flows through the IGBT region 10. The n-type carrier storage layer 2 and the n⁻-type drift layer 1 may be collectively referred to as a drift layer.

The n-type carrier storage layer 2 is formed by ion-implanting an n-type impurity into the semiconductor substrate constituting the n⁻-type drift layer 1 and then diffusing the implanted n-type impurity into the semiconductor substrate which is the n⁻-type drift layer 1 by annealing.

A p-type base layer 15 is provided on the first main surface side of the n-type carrier storage layer 2. The p-type base layer 15 is a semiconductor layer containing, for example, boron or aluminum as a p-type impurity, and the concentration of the p-type impurity is, for example, 1.0 E+12/cm³ to 1.0 E+19/cm³ inclusive. The p-type base layer is in contact with the gate trench insulating film 11b of the active trench gate 11.

The n⁺-type source layer 13 in contact with the gate trench insulating film 11b of the active trench gate 11 is provided in a part of the region on the first main surface side of the p-type base layer 15, and the p⁺-type contact layer 14 is selectively provided in the remaining region on the first main surface side of the p-type base layer 15. The n⁺-type source layer 13 and the p⁺-type contact layer 14 constitute the first main surface of the semiconductor substrate. The p⁺-type contact layer 14 is a region where the p-type impurity concentration is higher than the p-type impurity concentration of the p-type base layer 15. When it is necessary to distinguish between the p⁺-type contact layer 14 and the p-type base layer 15, they may be individually referred to, and when it is not necessary to distinguish between them, the p⁺-type contact layer 14 and the p-type base layer 15 may be collectively referred to as a p-type base layer.

On the second main surface side of the n⁻-type drift layer 1 of the semiconductor device 100, an n-type buffer layer 3 having a higher n-type impurity concentration than the n⁻-type drift layer 1 is provided. The n-type buffer layer 3 is provided to suppress punch-through of a depletion layer extending from the p-type base layer 15 to the second main surface side when the semiconductor device 100 is in an off state. The n-type buffer layer 3, for example, may be formed by implanting phosphorus (P) or protons (H⁺), or may be formed by implanting both phosphorus (P) and protons (H⁺). The n-type buffer layer 3 has an n-type impurity concentration of, for example, 1.0 E+12/cm³ to 1.0 E+18/cm³ inclusive. The semiconductor device 100 may have a configuration in which the n-type buffer layer 3 is not provided and the n⁻-type drift layer 1 is provided in the region of the n-type buffer layer 3 shown in FIG. 4. The n-type buffer layer 3 and the n⁻-type drift layer 1 may be collectively referred to as a drift layer.

On the second main surface side of the n-type buffer layer 3 of the semiconductor device 100, a p-type collector layer 16 is provided. That is, the p-type collector layer 16 is provided between the n⁻-type drift layer 1 and the second main surface. The p-type collector layer 16 is a semiconductor layer containing, for example, boron or aluminum as a p-type impurity, and the concentration of the p-type impurity is, for example, 1.0 E+16/cm³ to 1.0 E+20/cm³ inclusive. The p-type collector layer 16 constitutes the second main surface of the semiconductor substrate. The p-type collector layer 16 may be provided not only in the IGBT region 10 but also in the terminal region 30. Further, the p-type collector layer 16 may be provided so as to partially protrude from the IGBT region 10 into the diode region 20.

As shown in FIG. 4, in the IGBT region 10 of the semiconductor device 100, a trench that penetrates the p-type base layer 15 from the first main surface of the semiconductor substrate and reaches the n⁻-type drift layer 1 is provided. The gate trench electrode 11a is provided in some of the trenches with the gate trench insulating film 11b therebetween to form the active trench gate 11. The gate trench electrode 11a is opposed to the n⁻-type drift layer 1 with the gate trench insulating film 11b therebetween. The dummy trench electrode 12a is provided in some of the trenches with the dummy trench insulating film 12b therebetween to form the dummy trench gate 12. The dummy trench electrode 12a is opposed to the n⁻-type drift layer 1 with the dummy trench insulating film 12b therebetween.

The gate trench insulating film 11b of the active trench gate 11 is in contact with the p-type base layer 15 and the n⁺-type source layer 13. When a gate drive voltage is applied to the gate trench electrode 11a, a channel is formed in the p-type base layer 15 in contact with the gate trench insulating film 11b of the active trench gate 11.

As shown in FIG. 4, an interlayer insulating film 4 which is an insulating film is provided on the gate trench electrode 11a and the gate trench insulating film 11b of the active trench gate 11. An oxide film, for example, is used for the interlayer insulating film 4. A barrier metal 5 is provided on a region of the first main surface of the semiconductor substrate where the interlayer insulating film 4 is not provided and on the interlayer insulating film 4. The barrier metal 5 may be, for example, a conductor containing titanium (Ti), and to be specific, the barrier metal 5 may be titanium nitride or TiSi obtained by alloying titanium and silicon (Si). As shown in FIG. 4, the barrier metal 5 is in ohmic contact with the n⁺-type source layer 13, the p⁺-type contact layer 14, and the dummy trench electrode 12a, and is electrically connected to the n⁺-type source layer 13, the p⁺-type contact layer 14, and the dummy trench electrode 12a. On the other hand, the barrier metal 5 is electrically insulated from the gate trench electrode 11a by the interlayer insulating film 4.

An emitter electrode 6 is provided on the barrier metal 5. The emitter electrode 6 includes an aluminum electrode 6a, which is a metal electrode, and a plated electrode 6b. The material of the aluminum electrode 6a may be any material to be plated, for example, aluminum alloys such as aluminum-silicon alloys (Al—Si-based alloys).

The aluminum electrode 6a has an opening. The opening of the aluminum electrode 6a overlaps the gate trench insulating film 11b of the active trench gate 11 in plan view. In plan view, the opening of the aluminum electrode 6a may overlap the gate trench insulating film 11b and a part of the trenches, or may overlap the gate trench insulating film 11b and all of the trenches by being provided along the trenches, for example. In plan view, the opening of the aluminum electrode 6a may be closed holes, or may be open holes whose ends reach the end of the aluminum electrode 6a. The above description on the opening is also applicable to other preferred embodiments.

The opening of the aluminum electrode 6a is provided on the side opposite to the gate trench insulating film 11b with respect to the interlayer insulating film 4 in cross-sectional view.

In the first preferred embodiment, the plated electrode 6b is embedded in the opening of the aluminum electrode 6a using the aluminum electrode 6a as a material to be plated, and is provided on the aluminum electrode 6a. However, the plated electrode 6b may be provided at at least a portion of an inside of the opening of the aluminum electrode 6a. The plated electrode 6b is formed by, for example, electroless plating or electrolytic plating. The material of the plated electrode 6b, for example, may be nickel (Ni) or may contain nickel (Ni) and gold (Au). The nickel formed by electroless plating may also be referred to as NiP.

In the first preferred embodiment, the entire lower surface of the plated electrode 6b in the opening is in direct contact with the interlayer insulating film 4. However, at least a part of the lower surface of the plated electrode 6b may be in direct contact with the interlayer insulating film 4, and for example, a part of the lower surface of the plated electrode 6b may be in direct contact with the interlayer insulating film 4.

According to the configuration described above, in the opening of the aluminum electrode 6a, hydrogen generated during the growth treatment of the plated electrode 6b and hydrogen in the grown plated electrode 6b pass through the interlayer insulating film 4 and are taken into the gate trench insulating film 11b. The dangling bond corresponding to the interface state between the gate trench insulating film 11b and the silicon of the n⁻-type drift layer 1 is terminated by the taken hydrogen, and thus, a threshold voltage (Vth) of the semiconductor device can be stabilized. In addition, by adjusting the aperture ratio of the opening to the active trench gate 11, the amount of hydrogen supplied to the gate trench insulating film 11b can be adjusted, and thus, the threshold voltage of the semiconductor device can be adjusted.

Although not shown, the plated electrode 6b may be provided in the opening of the aluminum electrode 6a, the opening overlapping the dummy trench insulating film 12b of the dummy trench gate 12 in plan view and being provided on the side opposite to the dummy trench insulating film 12b with respect to the interlayer insulating film 4 in cross-sectional view.

In the case where there is a fine region such as a region between adjacent interlayer insulating films 4 where the emitter electrode 6 cannot be satisfactorily embedded, a tungsten film having a better embedding property than the emitter electrode 6 may be disposed in the fine region, and the emitter electrode 6 may be provided on the tungsten film. Instead of providing the barrier metal 5, the emitter electrode 6 may be provided on the n⁺-type source layer 13, the p⁺-type contact layer 14, and the dummy trench electrode 12a. Further, the barrier metal 5 may be provided only on the n-type semiconductor layer such as the n⁺-type source layer 13. The barrier metal 5 and the emitter electrode 6 may be collectively referred to as an emitter electrode.

Although FIG. 4 shows a configuration in which the interlayer insulating film 4 is not provided on the dummy trench electrode 12a of the dummy trench gate 12, the interlayer insulating film 4 may be provided on the dummy trench electrode 12a of the dummy trench gate 12 in the cross-sectional portion of FIG. 4. When the interlayer insulating film 4 is provided on the dummy trench electrode 12a of the dummy trench gate 12 in the cross-sectional portion of FIG. 4, the emitter electrode 6 and the dummy trench electrode 12a may be electrically connected to each other in another cross-sectional portion.

A collector electrode 7 is provided on the second main surface side of the p-type collector layer 16. Similar to the emitter electrode 6, the collector electrode 7 may be constituted of an aluminum alloy or a plurality of layers of an aluminum alloy and a plating film. The collector electrode 7 may have a configuration different from that of the emitter electrode 6. The collector electrode 7 is in ohmic contact with the p-type collector layer 16 and electrically connected to the p-type collector layer 16.

FIG. 5 is the cross-sectional view of the semiconductor device 100 taken along the dash-dotted line B-B in FIG. 3, and is the cross-sectional view of the IGBT region 10. Unlike the cross-sectional portion which is taken along the dash-dotted line A-A and shown in FIG. 4, in the cross-sectional portion which is taken along the dash-dotted line B-B and shown in FIG. 5, there is no n⁺-type source layer 13 which is in contact with the active trench gate 11 and provided on the first main surface side of the semiconductor substrate. That is, the n⁺-type source layer 13 shown in FIG. 3 is selectively provided on the first main surface side of the p-type base layer. Here, the p-type base layer includes the p-type base layer 15 and the p⁺-type contact layer 14.

<Diode Region 20>

FIG. 6 is a partially enlarged plan view showing a configuration of the diode region 20 of the semiconductor device which is an RC-IGBT. Specifically, FIG. 6 is an enlarged view of a region surrounded by a broken line 83 in the semiconductor device 100 shown in FIGS. 1 and 2.

FIGS. 7 and 8 are cross-sectional views each showing the configuration of the diode region 20 of the semiconductor device which is an RC-IGBT. Specifically, FIG. 7 is a cross-sectional view of the semiconductor device 100 taken along a dash-dotted line C-C shown in FIG. 6, and FIG. 8 is a cross-sectional view of the semiconductor device 100 taken along a dash-dotted line D-D shown in FIG. 6.

A diode trench gate 21 is extended along the first main surface of the semiconductor device 100 from one end side of the diode region 20 in the cell region toward the opposite other end side. The diode trench gate 21 is configured by providing a diode trench electrode 21a in a trench of the diode region 20 with a diode trench insulating film 21b therebetween. The diode trench electrode 21a is opposed to the n⁻-type drift layer 1 with the diode trench insulating film 21b therebetween.

Between two adjacent diode trench gates 21, a p⁺-type contact layer 24 and a p-type anode layer 25 having a p-type impurity concentration lower than that of the p⁺-type contact layer 24 are provided. The p⁺-type contact layer 24 is a semiconductor layer containing, for example, boron or aluminum as a p-type impurity, and the concentration of the p-type impurity is, for example, $1.0 \text{ E}+15/\text{cm}^3$ to $1.0 \text{ E}+20/\text{cm}^3$ inclusive. The p-type anode layer 25 is a semiconductor layer containing, for example, boron or aluminum as a p-type impurity, and the concentration of the p-type impurity is, for example, $1.0 \text{ E}+12/\text{cm}^3$ to $1.0 \text{ E}+19/\text{cm}^3$ inclusive. The p⁺-type contact layer 24 and the p-type anode layer 25 are alternately provided in the longitudinal direction of the diode trench gate 21.

FIG. 7 is the cross-sectional view of the semiconductor device 100 taken along the dash-dotted line C-C in FIG. 6, and is the cross-sectional view of the diode region 20. The semiconductor device 100 includes the n⁻-type drift layer 1 formed of a semiconductor substrate in the diode region 20 as in the IGBT region 10. The n⁻-type drift layer 1 of the diode region 20 and the n⁻-type drift layer 1 of the IGBT region 10 are continuously and integrally formed as the same semiconductor substrate.

The range of the semiconductor substrate is from the p⁺-type contact layer 24 to the n⁺-type cathode layer 26 in FIG. 7. In FIG. 7, the upper end of the p⁺-type contact layer 24 in the drawing is referred to as the first main surface of the semiconductor substrate, and the lower end of the n⁺-type cathode layer 26 in the drawing is referred to as the second main surface of the semiconductor substrate. The first main surface of the diode region 20 and the first main surface of the IGBT region 10 are included in the same surface, and the second main surface of the diode region 20 and the second main surface of the IGBT region 10 are included in the same surface.

As shown in FIG. 7, in the diode region 20, similar to the IGBT region 10, the n-type carrier storage layer 2 is provided on the first main surface side of the n⁻-type drift layer 1, and the n-type buffer layer 3 is provided on the second main surface side of the n⁻-type drift layer 1. The n-type carrier storage layer 2 and the n-type buffer layer 3 provided in the diode region 20 may have the same configuration as the n-type carrier storage layer 2 and the n-type buffer layer 3 provided in the IGBT region 10. The n-type carrier storage layer 2 is not necessarily provided in the IGBT region 10 and the diode region 20, and for example, the n-type carrier storage layer 2 may be provided in the IGBT region 10 but not in the diode region 20. Similar to the IGBT region 10, the n⁻-type drift layer 1, the n-type carrier storage layer 2, and the n-type buffer layer 3 may be collectively referred to as a drift layer.

The p-type anode layer 25 is provided on the first main surface side of the n-type carrier storage layer 2. The p-type anode layer 25 is provided between the n⁻-type drift layer 1 and the first main surface. The p-type anode layer 25 and the p-type base layer 15 may be simultaneously formed by setting the p-type impurity concentration of the p-type anode layer 25 to be the same as the p-type impurity concentration of the p-type base layer 15 of the IGBT region 10. Further, the concentration of the p-type impurity of the p-type anode layer 25 may be set lower than the concentration of the p-type impurity of the p-type base layer 15 of the IGBT region 10 to reduce the amount of electron holes injected into the diode region 20 during the diode operation. The recovery loss during the diode operation can be reduced by reducing the amount of electron holes injected during the diode operation.

The p⁺-type contact layer 24 is provided on the first main surface side of the p-type anode layer 25. The concentration of the p-type impurity of the p⁺-type contact layer 24 may be the same as or different from the concentration of the p-type impurity of the p⁺-type contact layer 14 of the IGBT region 10. The p⁺-type contact layer 24 constitutes the first main surface of the semiconductor substrate. The p⁺-type contact layer 24 is a region having a p-type impurity concentration higher than that of the p-type anode layer 25, and when the p⁺-type contact layer 24 and the p-type anode layer 25 need to be distinguished from each other, the p⁺-type contact layer 24 and the p-type anode layer 25 may be individually referred to, and when the p⁺-type contact layer 24 and the p-type anode layer 25 need not be distinguished from each other, the p⁺-type contact layer 24 and the p-type anode layer 25 may be collectively referred to as a p-type anode layer.

On the second main surface side of the n-type buffer layer 3 of the semiconductor device 100, the n⁺-type cathode layer 26 is provided. That is, the n⁺-type cathode layer 26 is provided between the n⁻-type drift layer 1 and the second main surface. The n⁺-type cathode layer 26 is a semiconductor layer containing, for example, arsenic or phosphorus as an n-type impurity, and the concentration of the n-type impurity is, for example, $1.0 \text{ E}+16/\text{cm}^3$ to $1.0 \text{ E}+21/\text{cm}^3$ inclusive. The n⁺-type cathode layer 26 is provided in a part or the whole of the diode region 20. The n⁺-type cathode layer 26 constitutes the second main surface of the semiconductor substrate. Although not shown, a p-type impurity may be further selectively implanted into a part of the region where the n⁺-type cathode layer 26 is formed to provide a p-type cathode layer which is a p-type semiconductor.

As shown in FIG. 7, in the diode region 20 of the semiconductor device 100, a trench that penetrates the p-type anode layer 25 from the first main surface of the semiconductor substrate and reaches the n⁻-type drift layer 1 is provided. The diode trench gate 21 is configured by providing the diode trench electrode 21a in a trench of diode region 20 with the diode trench insulating film 21b therebetween. The diode trench electrode 21a is opposed to the n⁻-type drift layer 1 with the diode trench insulating film 21b therebetween.

As shown in FIG. 7, the barrier metal 5 is provided on the diode trench electrode 21a and the p⁺-type contact layer 24. The barrier metal 5 is in ohmic contact with the diode trench electrode 21a and the p⁺-type contact layer 24, and is electrically connected to the diode trench electrode 21a and the p⁺-type contact layer 24. The barrier metal 5 may have the same configuration as that of the barrier metal 5 of the IGBT region 10.

The emitter electrode 6 is provided on the barrier metal 5. The emitter electrode 6 provided in the diode region 20 is configured to be continuous with the emitter electrode 6 provided in the IGBT region 10. Although not shown, as in the case of the IGBT region 10, the emitter electrode 6 of the diode region 20 may include the aluminum electrode 6a and the plated electrode 6b. The plated electrode 6b may be provided in the opening of the aluminum electrode 6a, the opening overlapping the diode trench insulating film 21b in plan view and being provided on the side opposite to the diode trench insulating film 21b with respect to the inter-layer insulating film 4 in cross-sectional view. In FIG. 7 and subsequent figures, for the sake of convenience, one of the emitter electrodes 6 may be shown regardless of whether the emitter electrode 6 includes the aluminum electrode 6a and the plated electrode 6b. The diode trench electrode 21a and the p⁺-type contact layer 24 may be brought into ohmic contact with the emitter electrode 6 without providing the barrier metal 5.

Although FIG. 7 shows a configuration in which the interlayer insulating film 4 as shown in FIG. 4 is not provided on the diode trench electrode 21a of the diode trench gate 21, the interlayer insulating film 4 may be provided on the diode trench electrode 21a in the cross-sectional portion of FIG. 7. When the interlayer insulating film 4 is provided on the diode trench electrode 21a of the diode trench gate 21 in the cross-sectional portion of FIG. 7, the emitter electrode 6 and the diode trench electrode 21a may be electrically connected to each other in another cross-sectional portion.

The collector electrode 7 is provided on the second main surface side of the n⁺-type cathode layer 26. Like the emitter electrode 6, the collector electrode 7 of the diode region 20 is configured to be continuous with the collector electrode 7 provided in the IGBT region 10. The collector electrode 7 is in ohmic contact with the n⁺-type cathode layer 26 and is electrically connected to the n⁺-type cathode layer 26.

FIG. 8 is the cross-sectional view of the semiconductor device 100 taken along the dash-dotted line D-D in FIG. 6, and is the cross-sectional view of the diode region 20. Unlike the cross-sectional portion which is taken along the dash-dotted line C-C and shown in FIG. 7, the p⁺-type contact layer 24 is not provided between the p-type anode layer 25 and the barrier metal 5 in the cross-sectional portion which is taken along the dash-dotted line D-D and shown in FIG. 8, and the p-type anode layer 25 is the first main surface of the semiconductor substrate. That is, the p⁺-type contact layer 24 shown in FIG. 7 is selectively provided on the first main surface side of the p-type anode layer 25.

<Configuration of a Boundary Region Between the IGBT Region 10 and the Diode Region 20>

FIG. 9 is a cross-sectional view showing a configuration of a boundary region between the IGBT region 10 and the diode region 20 of the semiconductor device which is an RC-IGBT. Specifically, FIG. 9 is a cross-sectional view of the semiconductor device 100 taken along a dash-dotted line E-E shown in FIGS. 1 and 2.

As shown in FIG. 9, the p-type collector layer 16 provided on the second main surface side of the IGBT region 10 and the n⁺-type cathode layer 26 provided on the second main surface side of the diode region 20 are adjacent to each other in the in-plane direction of the semiconductor substrate. The p-type collector layer 16 is provided to protrude from the boundary between the IGBT region 10 and the diode region 20 toward the diode region 20 by a distance U1.

Thus, by providing the p-type collector layer 16 so as to protrude into the diode region 20, the distance between the n⁺-type cathode layer 26 of the diode region 20 and the active trench gate 11 can be increased. Therefore, when a gate drive voltage is applied to the gate trench electrode 11a during operation of a freewheeling diode, it is possible to suppress the current from flowing from the channel formed adjacent to the active trench gate 11 of the IGBT region 10 to the n⁺-type cathode layer 26. The distance U1 may be, for example, 100 μm. Depending on the application of the semiconductor device 100, which is an RC-IGBT, the distance U1 may be 0 or less than 100 μm.

<Terminal Region 30>

FIGS. 10 and 11 are cross-sectional views each showing the configuration of the terminal region 30 of the semiconductor device 100 which is an RC-IGBT. Specifically, FIG.

10 is a cross-sectional view taken along a dash-dotted line F-F in FIG. 1 or 2, and is a cross-sectional view from the IGBT region 10 to the terminal region 30. FIG. 11 is a cross-sectional view taken along a dash-dotted line G-G in FIG. 1, and is a cross-sectional view from the diode region 20 to the terminal region 30.

As shown in FIGS. 10 and 11, the terminal region 30 of the semiconductor device 100 has the n⁻-type drift layer 1 between the first main surface and the second main surface of the semiconductor substrate. The first main surface and the second main surface of the terminal region 30 are included in the same surfaces as the first main surface and the second main surface of the IGBT region 10 and the diode region 20, respectively. The n⁻-type drift layer 1 of the terminal region 30 has the same configuration as the n⁻-type drift layer 1 of each of the IGBT region 10 and the diode region 20, and is continuous and integral with the n⁻-type drift layer 1 of each of the IGBT region 10 and the diode region 20.

A p-type terminal well layer 31 is selectively provided on the first main surface side of the n⁻-type drift layer 1, that is, between the first main surface of the semiconductor substrate and the n⁻-type drift layer 1. The p-type terminal well layer 31 is a semiconductor layer containing, for example, boron or aluminum as a p-type impurity, and the concentration of the p-type impurity is, for example, 1.0 E+14/cm³ to 1.0 E+19/cm³ inclusive. The p-type terminal well layer 31 is provided to surround a cell region including the IGBT region 10 and the diode region 20. The p-type terminal well layer 31 is provided in a plurality of ring shapes, and the number of the p-type terminal well layers 31 to be provided is appropriately selected depending on the withstand voltage design of the semiconductor device 100. In addition, an n⁺-type channel stopper layer 32 is provided on a further outer edge side of the p-type terminal well layer 31, and the n⁺-type channel stopper layer 32 surrounds the p-type terminal well layer 31 in plan view.

A p-type terminal collector layer 16a is provided between the n⁻-type drift layer 1 of the terminal region 30 and the second main surface of the semiconductor substrate. The p-type terminal collector layer 16a is continuous and integral with the p-type collector layer 16 provided in the IGBT region 10 of the cell region. Therefore, the p-type terminal collector layer 16a may also be collectively referred to as a p-type collector layer.

In the configuration in which the diode region 20 is provided adjacent to the terminal region 30 as the semiconductor device 100 shown in FIG. 1, the p-type terminal collector layer 16a is provided in a manner that the end portion thereof on the diode region 20 side protrudes into the diode region 20 by a distance U2, as shown in FIG. 11. According to such a configuration, the distance between the n⁺-type cathode layer 26 of the diode region 20 and the p-type terminal well layer 31 can be increased, and thus, the p-type terminal well layer 31 can be suppressed from operating as the anode of the diode. The distance U2 may be, for example, 100 μm.

The collector electrode 7 is provided on the second main surface of the semiconductor substrate. The collector electrode 7 is continuously and integrally formed from a cell region including the IGBT region 10 and the diode region 20 to the terminal region 30.

On the other hand, the emitter electrode 6 which is continuous from the cell region and the terminal electrode 36 which is structurally separated from the emitter electrode 6 are provided on the first main surface of the semiconductor substrate of the terminal region 30. The emitter electrode 6 and the terminal electrode 36 are electrically connected via a semi-insulating film 33. The semi-insulating film 33 may be, for example, sinSiN (semi-insulating Silicon Nitride). The terminal electrode 36 is electrically connected to each of the p-type terminal well layer 31 and the n$^+$-type channel stopper layer 32 via a contact hole of the interlayer insulating film 4 provided on the first main surface of the terminal region 30. The terminal region 30 is provided with a terminal protection film 34 that covers the emitter electrode 6, the terminal electrode 36, and the semi-insulating film 33. The terminal protection film 34 is, for example, polyimide.

<Method of Manufacturing RC-IGBT>

FIGS. 12A to 17B are cross-sectional views each showing the method of manufacturing the semiconductor device which is an RC-IGBT. FIGS. 12A to 15B are views showing a process of mainly forming the front surface side of the boundary region of FIG. 9 of the semiconductor device 100, and FIGS. 16A to 17B are views showing a process of mainly forming the back surface side of the boundary region of FIG. 9 of the semiconductor device 100. FIG. 18 is a flowchart showing a part of a method of manufacturing the semiconductor device according to the first preferred embodiment.

First, as shown in FIG. 12A, a semiconductor substrate constituting the n$^-$-type drift layer 1 is prepared. The semiconductor substrate may be, for example, an FZ wafer manufactured by an FZ (Floating Zone) method or an MCZ wafer manufactured by an MCZ (Magnetic field applied Czochralski) method, or may be an n-type wafer containing an n-type impurity. The concentration of the n-type impurity contained in the semiconductor substrate is appropriately selected depending on the withstand voltage of the semiconductor device to be manufactured. For example, in a semiconductor device having a withstand voltage of 1200 V, the concentration of the n-type impurity is adjusted so that the resistivity of the n$^-$-type drift layer 1 constituting the semiconductor substrate ranges approximately from 40 to 120 Ω·cm inclusive. As shown in FIG. 12A, in the process of preparing the semiconductor substrate, the entire semiconductor substrate is the n$^-$-type drift layer 1. By implanting p-type or n-type impurity ions from the first main surface side or the second main surface side of such a semiconductor substrate and then diffusing them into the semiconductor substrate by heat treatment or the like, a p-type or n-type semiconductor layer is appropriately formed, and the semiconductor device 100 is manufactured.

As shown in FIG. 12A, the semiconductor substrate constituting the n$^-$-type drift layer 1 has regions which are to be the IGBT region 10 and the diode region 20. Although not shown, a region to be the terminal region 30 or the like is provided around the regions which are to be the IGBT region 10 and the diode region 20. Hereinafter, a method of manufacturing the configuration of the IGBT region 10 and the diode region 20 of the semiconductor device 100 will be mainly described, but the terminal region 30 and the like of the semiconductor device 100 may be manufactured by a known manufacturing method. For example, when the FLR having the p-type terminal well layer 31 is formed as the withstand voltage maintaining structure in the terminal region 30, the FLR may be formed by implanting p-type impurity ions before the IGBT region 10 and the diode region 20 of the semiconductor device 100 are processed. Alternatively, when the p-type impurity is ion-implanted into the IGBT region 10 or the diode region 20 of the semiconductor device 100, the p-type impurity ions may be implanted to form the FLR simultaneously.

Next, as shown in FIG. 12B, an n-type impurity such as phosphorus (P) is implanted from the first main surface side of the semiconductor substrate to form the n-type carrier storage layer 2. A p-type impurity such as boron (B) is implanted from the first main surface side of the semiconductor substrate to form the p-type base layer 15 and the p-type anode layer 25. The n-type carrier storage layer 2, the p-type base layer 15, and the p-type anode layer 25 are formed by implanting impurity ions into the semiconductor substrate and then diffusing the impurity ions by heat treatment. Since the ion implantation of the n-type impurity and the p-type impurity is performed after a mask treatment is performed on the first main surface of the semiconductor substrate, various layers are selectively formed on the first main surface side of the semiconductor substrate. The n-type carrier storage layer 2, the p-type base layer 15, and the p-type anode layer 25 are formed in the IGBT region 10 and the diode region 20, and are connected to the p-type terminal well layer 31 in the terminal region 30. The mask treatment is a treatment in which a resist is applied onto the semiconductor substrate, an opening is formed in a predetermined region of the resist using a photolithography technique, and a mask is formed on the semiconductor substrate in order to perform ion implantation or etching on a predetermined region of the semiconductor substrate through the opening. By the mask treatment and the ion implantation described above, the n-type carrier storage layer 2, the p-type base layer 15, and the p-type anode layer 25 are selectively formed on the first main surface side of the IGBT region 10 and the diode region 20. Similarly, the p-type terminal well layer 31 is selectively formed in the terminal region 30.

The p-type impurities of the p-type base layer 15 and the p-type anode layer 25 may be ion-implanted simultaneously. In this case, the p-type base layer 15 and the p-type anode layer 25 have the same depth and the same p-type impurity concentration. Further, the p-type base layer 15 and the p-type anode layer 25 may be made different in depth and p-type impurity concentration from each other by separately ion-implanting the p-type impurities of the p-type base layer 15 and the p-type anode layer 25 by mask treatment.

The p-type impurities of the p-type terminal well layer 31 and the p-type anode layer 25, which are not shown in FIG. 12B, may be ion-implanted simultaneously. In this case, the p-type terminal well layer 31 and the p-type anode layer 25 have the same depth and the same p-type impurity concentration. Alternatively, the p-type terminal well layer 31 and the p-type anode layer 25 may be made different in depth and p-type impurity concentration from each other by separately ion-implanting the p-type impurities to the p-type terminal well layer 31 and the p-type anode layer 25 by mask treatment. Alternatively, the p-type terminal well layer 31 and the p-type anode layer 25 may be made different in p-type impurity concentration from each other by simultaneously ion-implanting the p-type impurities to the p-type terminal well layer 31 and the p-type anode layer 25 using masks with different aperture ratios. In this case, one or both of the masks may be mesh-like masks, and the aperture ratios of the masks may be different from each other. Similarly, the p-type impurities of the p-type terminal well layer 31, the p-type base layer 15, and the p-type anode layer 25 may be ion-implanted simultaneously using masks with different aperture ratios.

Next, as shown in FIG. 13A, an n-type impurity is selectively implanted into the first main surface side of the p-type base layer 15 of the IGBT region 10 by mask treatment to form the n$^+$-type source layer 13. The n-type impurity to be implanted may be, for example, arsenic (As)

or phosphorus (P). Further, by mask treatment, a p-type impurity is implanted into the first main surface side of the p-type base layer 15 of the IGBT region 10 to form the p⁺-type contact layer 14, and a p-type impurity is selectively implanted into the first main surface side of the p-type anode layer 25 of the diode region to form the p⁺-type contact layer 24. The p-type impurity to be implanted may be, for example, boron or aluminum.

Next, as shown in FIG. 13B, a trench 8 is formed to penetrate the p-type base layer 15 and the p-type anode layer 25 from the first main surface side of the semiconductor substrate and reach the n⁻-type drift layer 1. In the IGBT region 10, the side wall of the trench 8 penetrating the n⁺-type source layer 13 includes a part of the n⁻-type source layer 13. In the IGBT region 10, the side wall of the trench 8 penetrating the p⁺-type contact layer 14 includes a part of the p⁺-type contact layer 14. In the diode region 20, the side wall of the trench 8 penetrating the p⁺-type contact layer 24 includes a part of the p⁺-type contact layer 24.

For example, the trench 8 is formed by depositing an oxide film such as SiO₂ on the semiconductor substrate, forming an opening in the oxide film at a portion where the trench 8 is to be formed by a mask treatment, and etching the semiconductor substrate using the oxide film having the opening as a mask. In FIG. 13B, the pitch of the trench 8 in the IGBT region 10 is formed to be the same as that in the diode region 20, but the pitch of the trench 8 in the IGBT region 10 may be different from that in the diode region 20. The pitch and the pattern in plan view of the trench 8 can be appropriately changed by the mask pattern of the mask treatment.

Next, as shown in FIG. 14A, the semiconductor substrate is heated in an atmosphere containing oxygen to form an oxide film 9 on the inner wall of the trench 8 and the first main surface of the semiconductor substrate. The oxide film 9 formed in the trench 8 of the IGBT region 10 is the gate trench insulating film 11b of the active trench gate 11 and the dummy trench insulating film 12b of the dummy trench gate 12. The oxide film 9 formed in the trench 8 of the diode region 20 is the diode trench insulating film 21b. Thus, the gate trench insulating film 11b is substantially provided on the semiconductor substrate (see step S1 in FIG. 18). The oxide film 9 formed on the first main surface of the semiconductor substrate is removed in a later process except for the portion formed in the trench 8.

Next, as shown in FIG. 14B, polysilicon doped with an n-type or p-type impurity is deposited on the oxide film 9 in the trench 8 by CVD (chemical vapor deposition) or the like to form the gate trench electrodes 11a, the dummy trench electrode 12a, and the diode trench electrode 21a.

Next, as shown in FIG. 15A, the interlayer insulating film 4 is formed on the gate trench electrode 11a of the active trench gate 11 of the IGBT region 10 and on the gate trench insulating film 11b of the oxide film 9 (see step S1 in FIG. 18). The interlayer insulating film 4 may be, for example, SiO₂. Formation of contact holes in the deposited insulating film to be the interlayer insulating film 4 and removal of the oxide film 9 formed on the first main surface of the semiconductor substrate are performed by a mask treatment, thereby forming the interlayer insulating film 4 and the like of FIG. 15A. The contact holes of the interlayer insulating film 4 are formed on the n⁺-type source layers 13, the p⁺-type contact layer 14, the p⁺-type contact layer 24, the dummy trench electrode 12a, and the diode trench electrode 21a.

Next, as shown in FIG. 15B, the barrier metal 5 is formed on the first main surface of the semiconductor substrate and the interlayer insulating film 4. The barrier metal 5 is formed by depositing titanium nitride by PDV (physical vapor deposition) or CVD.

Then, the emitter electrode 6 is formed on the barrier metal 5. In the IGBT region 10, the emitter electrode 6 including the aluminum electrode 6a and the plated electrode 6b is formed as shown in FIGS. 4 and 5. Here, the emitter electrode 6 of the IGBT region 10 will be described. First, an aluminum-silicon alloy (Al—Si alloy) is deposited on the barrier metal 5 by PVD such as sputtering or vapor deposition to form the aluminum electrode 6a (see step S2 in FIG. 18). Then, the opening of the aluminum electrode 6a, that is, the opening overlapping the gate trench insulating film 11b in plan view is formed by performing a mask treatment on the aluminum electrode 6a (see step S3 in FIG. 18).

Next, electroless plating or electrolytic plating is performed using the aluminum electrode 6a as the material to be plated. As a result, the plating grows in the lateral direction from the side wall of the opening of the aluminum electrode 6a, that is, the side wall of the aluminum electrode 6a, and the plated electrode 6b is formed at at least a portion of the inside of the opening of the aluminum electrode 6a (see step S4 in FIG. 18). When the width of the opening of the aluminum electrode 6a is smaller than the thickness of the plated electrode 6b, the plated electrode 6b is embedded in the opening of the aluminum electrode 6a.

By forming the emitter electrode 6 including the aluminum electrode 6a and the plated electrode 6b in this way, the characteristics of the semiconductor device can be stabilized as described above. Further, since a thick metal film can be easily formed as the emitter electrode 6, the heat capacity of the emitter electrode 6 can be increased to improve the heat resistance. When a nickel alloy is further formed by plating treatment after the emitter electrode 6 made of the aluminum-silicon alloy is formed by PVD, the plating treatment for forming the nickel alloy may be performed after the second main surface side of the semiconductor substrate is processed.

Figure 16A:
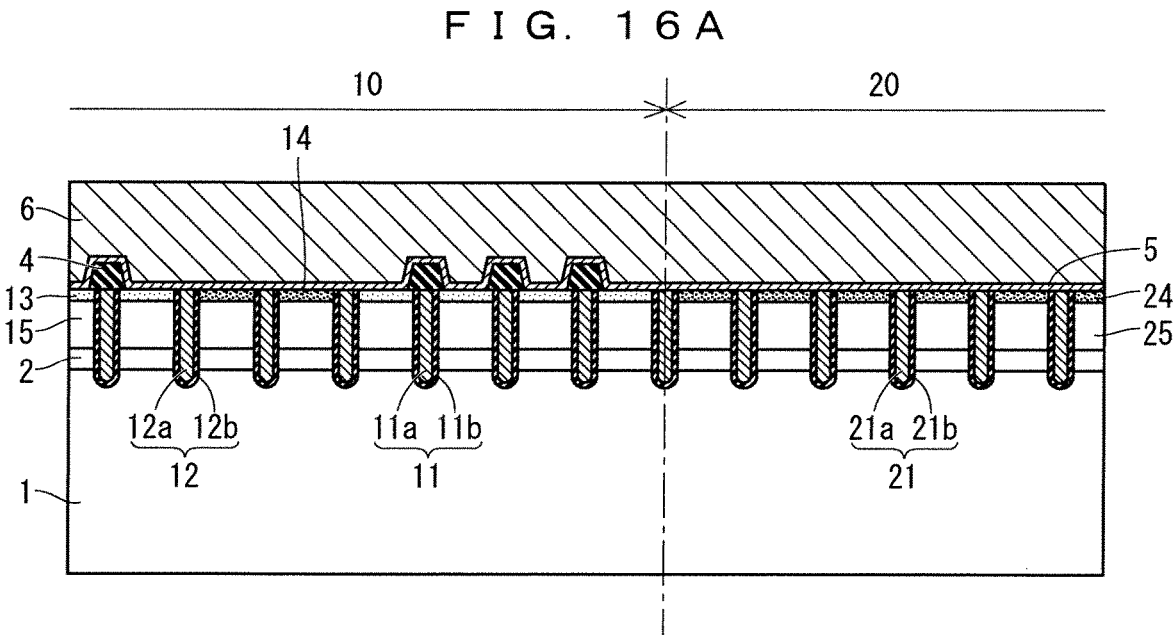

Next, as shown in FIG. 16A, the second main surface side of the semiconductor substrate is ground to thin the semiconductor substrate to a designed predetermined thickness. The thickness of the semiconductor substrate after grinding may be, for example, 80 μm to 200 μm inclusive.

Figure 16B:
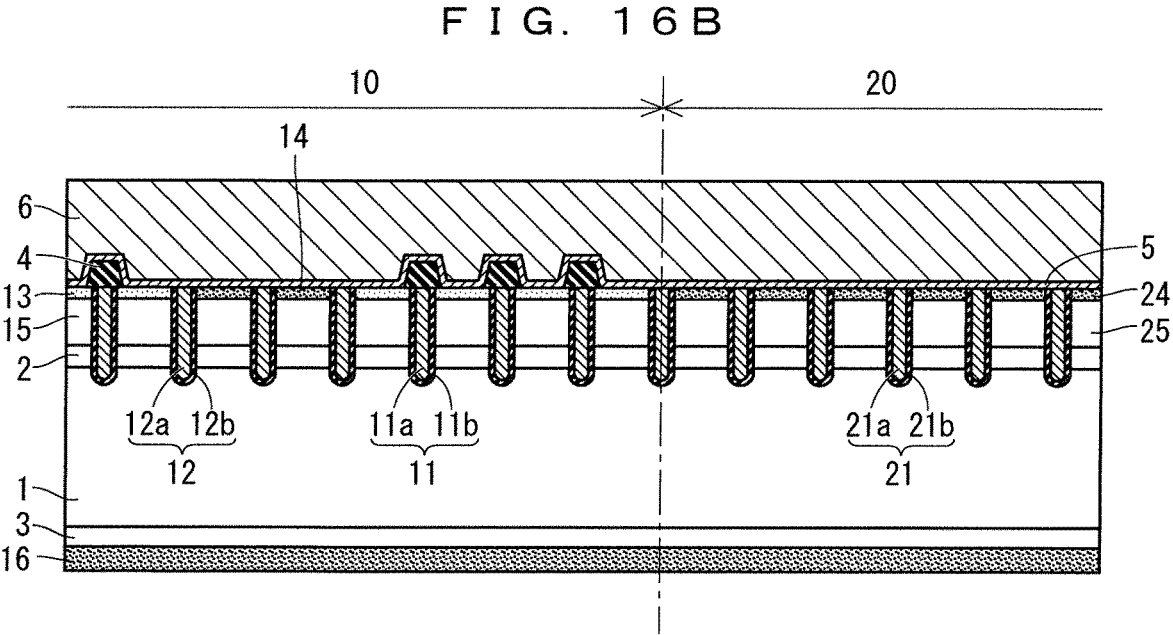

Next, as shown in FIG. 16B, an n-type impurity is implanted from the second main surface side of the semiconductor substrate to form the n-type buffer layer 3. Further, a p-type impurity is implanted from the second main surface side of the semiconductor substrate to form the p-type collector layer 16. The n-type buffer layer 3 may be formed in the IGBT region 10, the diode region 20, the terminal region 30, and the like, or may be formed only in the IGBT region 10 or the diode region 20. The n-type buffer layer 3 may be formed, for example, by implanting phosphorus (P) ions, by implanting protons (H⁺), or by implanting both protons and phosphorus. Protons can be implanted from the second main surface of the semiconductor substrate to a deep position with relatively low acceleration energy. In addition, the depth to which protons are implanted can be changed relatively easily by changing the acceleration energy. Therefore, when the n-type buffer layer 3 is formed with protons, the n-type buffer layer 3 that is thicker in the thickness direction of the semiconductor substrate than that formed with phosphorus can be formed by implanting protons a plurality of times while changing the acceleration energy.

In addition, since phosphorus can increase an activation rate as an n-type impurity as compared with protons, when the n-type buffer layer 3 is formed of phosphorus, punch-through of the depletion layer can be suppressed in a thinned semiconductor substrate. In order to further thin the semiconductor substrate, it is preferable to form the n-type buffer layer 3 by implanting both protons and phosphorus, and in this case, protons are implanted at a position deeper than phosphorus from the second main surface.

The p-type collector layer 16 may be formed by implanting, for example, boron (B). The p-type collector layer 16 is also formed in the terminal region 30, and the p-type collector layer 16 of the terminal region 30 serves as the p-type terminal collector layer 16a. After ion implantation from the second main surface side of the semiconductor substrate, laser annealing is performed by irradiating the second main surface with a laser, whereby the implanted boron is activated and the p-type collector layer 16 is formed. At this time, phosphorus implanted at a relatively shallow position from the second main surface of the semiconductor substrate is also simultaneously activated. On the other hand, since protons are activated at a relatively low annealing temperature of 350° C. to 500° C., it is necessary to pay attention so that the entire semiconductor substrate does not reach a temperature higher than 350° C. to 500° C. except in the process for activating protons after protons are implanted. Since only the vicinity of the second main surface of the semiconductor substrate can be heated to a high temperature by laser annealing, the laser annealing can be used for activation of the n-type impurity and the p-type impurity after the proton implantation.

Next, as shown in FIG. 17A, the $n^+$-type cathode layer 26 is formed on the second main surface side of the diode region 20. The $n^+$-type cathode layer 26 may be formed by implanting phosphorus (P), for example. As shown in FIG. 17A, an n-type impurity is selectively implanted from the second main surface side by mask treatment so that the boundary between the p-type collector layer 16 and the $n^+$-type cathode layer 26 is located at a distance U1 from the boundary between the IGBT region 10 and the diode region 20 toward the diode region 20. The implantation amount of the n-type impurity for forming the $n^+$-type cathode layer 26 is larger than the implantation amount of the p-type impurity for forming the p-type collector layer 16. In FIG. 17A, the p-type collector layer 16 and the $n^+$-type cathode layer 26 have the same depth from the second main surface, but the depth of the $n^+$-type cathode layer 26 is equal to or greater than the depth of the p-type collector layer 16. In the region where the $n^+$-type cathode layer 26 is formed, the n-type impurity needs to be implanted into the region into which the p-type impurity has been implanted to form an n-type semiconductor, and thus the concentration of the n-type impurity is higher than the concentration of the p-type impurity implanted in the entire region where the $n^+$-type cathode layer 26 is formed.

Next, as shown in FIG. 17B, the collector electrode 7 is formed on the second main surface of the semiconductor substrate. The collector electrode 7 is formed over the entire surface of the IGBT region 10, the diode region 20, the terminal region 30, and the like on the second main surface. The collector electrode 7 may be formed over the entire second main surface of the n-type wafer which is the semiconductor substrate. The collector electrode 7 may be formed by depositing an aluminum-silicon alloy (Ai-Si alloy), titanium (Ti), or the like by PVD such as sputtering or vapor deposition, or may be formed by stacking a plurality of metals such as an aluminum-silicon alloy, titanium, nickel, or gold. Alternatively, the collector electrode 7 may be formed by further forming a metal film by electroless plating or electrolytic plating on the metal film formed by PVD.

The semiconductor device 100 is manufactured through the above-described process. A plurality of the semiconductor devices 100,100 are manufactured in a state of being integrated in a matrix on a semiconductor substrate such as one n-type wafer. Therefore, the semiconductor device 100 is cut into individual semiconductor devices 100 by laser dicing or blade dicing.

Summary of First Preferred Embodiment

According to the semiconductor device of the first preferred embodiment described above, the plated electrode 6b is provided in the opening of the aluminum electrode 6a, the opening overlapping the gate trench insulating film 11b in plan view and being provided on the side opposite to the gate trench insulating film 11b with respect to the interlayer insulating film 4 in cross-sectional view. According to such a configuration, the dangling bond is terminated by the hydrogen of the plated electrode 6b, and thus, the characteristics relating to the threshold voltage (Vth) of the semiconductor device can be stabilized. This is effective when the function of the barrier metal 5 is not sufficient for the reason that the barrier metal 5 is thin, for example, and is more effective in a semiconductor device in which the barrier metal 5 is not provided.

In the first preferred embodiment, the entire lower surface of the plated electrode 6b in the opening is in direct contact with the interlayer insulating film 4. According to such a configuration, the dangling bond can be easily terminated by the hydrogen of the plated electrode 6b.

Second Preferred Embodiment

Figure 19:
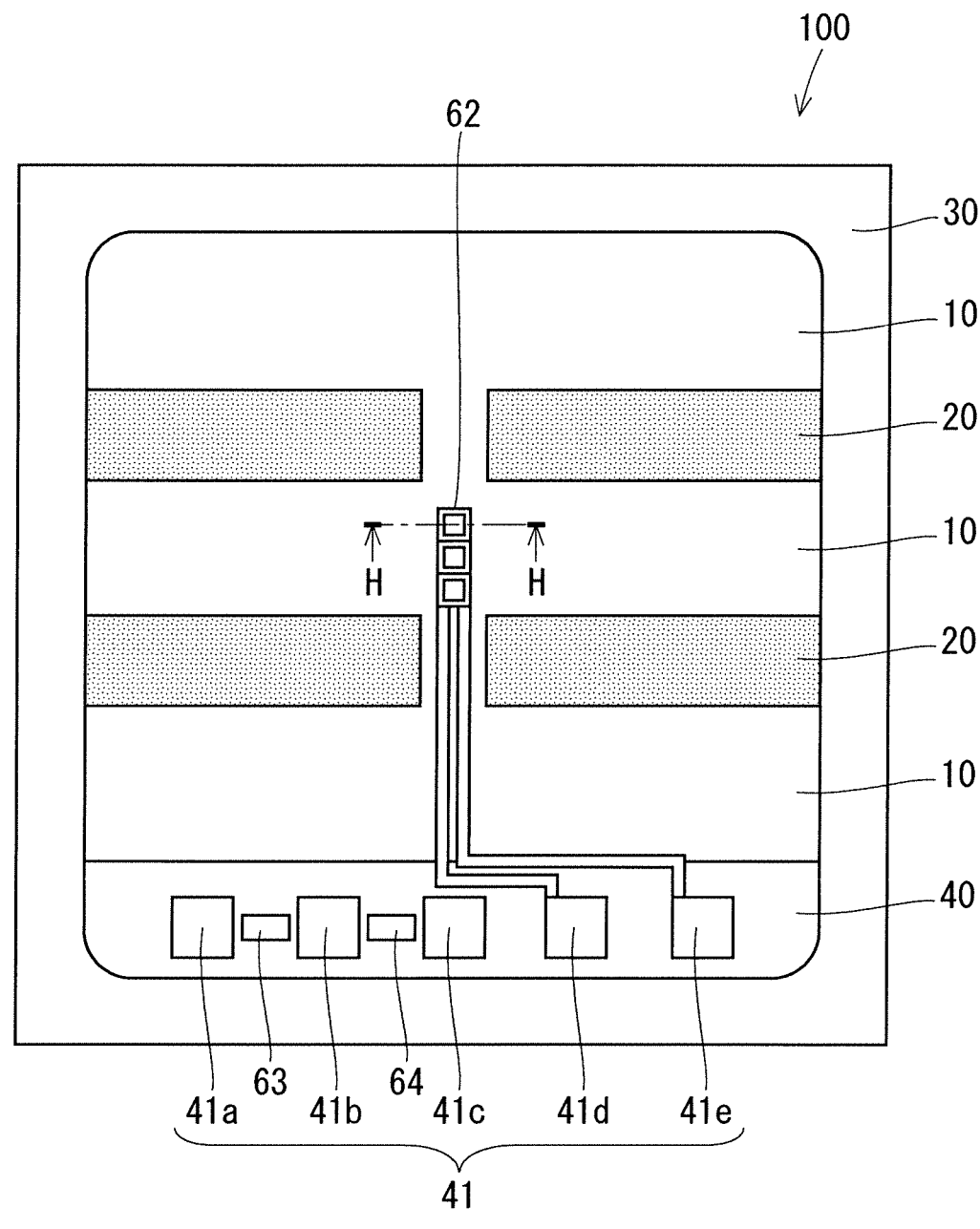
FIG. 19 is a plan view showing a configuration of a semiconductor device according to a second preferred embodiment.

FIG. 19 is a plan view showing a configuration of a semiconductor device which is an RC-IGBT according to a second preferred embodiment. The second preferred embodiment is similar to a configuration in which a temperature sense diode region 62 for monitoring the temperature, a current sense region 63 for monitoring the current, and a protection diode region 64 for protecting the semiconductor device are provided in the configurations of FIGS. 1 and 2. The temperature sense diode region 62 is provided adjacent to the IGBT region 10, and the current sense region 63 and the protection diode region 64 are provided adjacent to the pad region 40.

Figure 20:
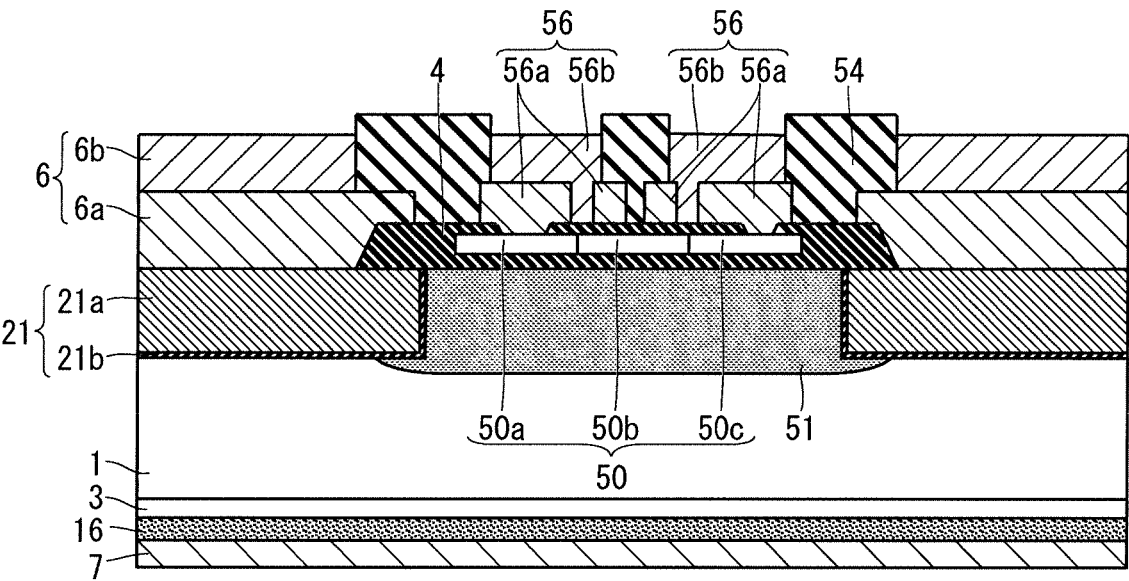
FIG. 20 is a cross-sectional view showing a configuration of a temperature sense diode region of the semiconductor device according to the second preferred embodiment.

FIG. 20 is a cross-sectional view showing the configuration of the temperature sense diode region 62 according to the second preferred embodiment, and specifically, a cross-sectional view of the semiconductor device 100 taken along a dash-dotted line H-H shown in FIG. 19. Although the barrier metal 5 is not provided in the second preferred embodiment, the barrier metal 5 may be provided as in the first preferred embodiment.

In the temperature sense diode region 62, a p-type well layer 51 similar to the p-type terminal well layer 31 is provided on the $n^-$-type drift layer 1. The interlayer insulating film 4 is provided on the p-type well layer 51, and a pn junction 50 is provided inside the interlayer insulating film 4. The pn junction 50 is included in the semiconductor portion. The pn junction 50 according to the second preferred embodiment includes an $n^+$-type polysilicon cathode layer 50a, a $p^-$-type polysilicon anode layer 50b, and a $p^+$-type polysilicon anode contact layer 50c.

An electrode 56 is insulated from the emitter electrode 6 by a protection film 54 made of polyimide, for example. In the second preferred embodiment, similar to the emitter electrode 6 of the first preferred embodiment, the electrode 56 includes an aluminum electrode 56a, which is a metal electrode, and a plated electrode 56b. However, in the second preferred embodiment, the opening of the aluminum electrode 56a overlaps the pn junction 50 provided in the temperature sense diode region 62 in plan view. In plan view, the opening may be provided along the junction between the n$^+$-type polysilicon cathode layer 50a and the p$^-$-type polysilicon anode layer 50b or the junction between the p$^-$-type polysilicon anode layer 50b and the p$^+$-type polysilicon anode contact layer 50c, or may be provided in a manner of overlapping a part of the junctions.

The opening of the aluminum electrode 56a is provided on the side opposite to the pn junction 50 with respect to the upper portion of the interlayer insulating film 4 in cross-sectional view.

In the second preferred embodiment, the plated electrode 56b is embedded in the opening of the aluminum electrode 56a using the aluminum electrode 56a as a material to be plated, and is provided on the aluminum electrode 56a. However, the plated electrode 56b may be provided at at least a portion of an inside of the opening of the aluminum electrode 56a. In the second preferred embodiment, the entire lower surface of the plated electrode 56b in the opening is in direct contact with the interlayer insulating film 4. However, at least a part of the lower surface of the plated electrode 56b may be in direct contact with the interlayer insulating film 4, and for example, a part of the lower surface of the plated electrode 56b may be in direct contact with the interlayer insulating film 4.

According to the configuration described above, in the opening of the aluminum electrode 56a, hydrogen generated during the growth treatment of the plated electrode 56b and hydrogen in the grown plated electrode 56b pass through the interlayer insulating film 4 and are taken into the polysilicon of the pn junction 50. Since the dangling bond corresponding to the interface state of the grain boundary of the polysilicon is terminated by the taken hydrogen, the forward voltage (VFAK) of the temperature sense diode region 62 can be stabilized. Further, since the amount of hydrogen supplied to the pn junction 50 can be adjusted by adjusting the aperture ratio of the opening to the pn junction 50, the forward voltage of the semiconductor device can be adjusted.

<Manufacturing Method>

FIG. 21 is a flowchart showing a part of a method of manufacturing the semiconductor device according to the second preferred embodiment, and the manufacturing method of FIG. 21 corresponds to the manufacturing method of FIG. 18.

In step S11, a lower portion of the interlayer insulating film 4 is formed on the p-type well layer 51, and the pn junction 50 is formed on the lower portion. Then, an upper portion of the interlayer insulating film 4 is formed on the pn junction 50, and an opening for partially exposing the pn junction 50 is provided in the upper portion of the interlayer insulating film 4.

In step S12, the aluminum-silicon alloy (Al—Si alloy) is deposited on the interlayer insulating film 4 by PVD such as sputtering or vapor deposition to form the aluminum electrode 56a.

In step S13, the opening of the aluminum electrode 56a, that is, the opening overlapping the pn junction 50 in plan view is formed by performing a mask treatment on the aluminum electrode 56a.

In step S14, electroless plating or electrolytic plating is performed using the aluminum electrodes 56a as a material to be plated. As a result, the plating grows in the lateral direction from the side wall of the opening of the aluminum electrode 56a, that is, the side wall of the aluminum electrode 56a, and the plated electrode 56b is formed at at least a portion of the inside of the opening of the aluminum electrode 56a.

Summary of Second Preferred Embodiment

According to the semiconductor device of the second preferred embodiment described above, the plated electrode 56b is provided in the opening of the aluminum electrode 56a, the opening overlapping the pn junction 50 in plan view and being provided on the side opposite to the pn junction 50 with respect to the interlayer insulating film 4 in cross-sectional view. According to such a configuration, the dangling bond is terminated by the hydrogen of the plated electrode 56b, and thus, the characteristics relating to the forward voltage (VFAK) of the semiconductor device can be stabilized. This is particularly effective in a semiconductor device in which the barrier metal 5 is not provided.

In the second preferred embodiment, the entire lower surface of the plated electrode 56b in the opening is in direct contact with the interlayer insulating film 4. According to such a configuration, the dangling bond can be easily terminated by the hydrogen of the plated electrode 56b.

Third Preferred Embodiment

FIG. 22 is a cross-sectional view showing a configuration of a temperature sense diode region 62 according to a third preferred embodiment. The configuration according to the third preferred embodiment shown in FIG. 22 is the same as the configuration according to the second preferred embodiment shown in FIG. 20 except that the polyimide protection film 54 is replaced with a semi-insulating protection film 58.

The plated electrode 56b is formed at the portion of the opening of the aluminum electrode 56a other than the protection film 58. That is, the protection film 58 is provided in the opening of the aluminum electrode 56a to separate the plated electrode 56b. In the third preferred embodiment, the plated electrode 56b is provided on the side wall of the opening of the aluminum electrode 56a using the protection film 58. Further, the protection film 58 may be patterned along the junction between the n$^+$-type polysilicon cathode layer 50a and the p$^-$-type polysilicon anode layer 50b or the junction between the p$^-$-type polysilicon anode layer 50b and the p$^+$-type polysilicon anode contact layer 50c.

In the third preferred embodiment, the entire lower surface of the plated electrode 56b in the opening is in direct contact with the interlayer insulating film 4. However, at least a part of the lower surface of the plated electrode 56b may be in direct contact with the interlayer insulating film 4, and for example, a part of the lower surface of the plated electrode 56b may be in direct contact with the interlayer insulating film 4.

Summary of Third Preferred Embodiment

According to the semiconductor device of the third preferred embodiment described above, the protection film 58 is provided in the opening of the aluminum electrode 56a to separate the plated electrode 56b. According to such a configuration, the shape of the plated electrode 56b can be made complicated due to the protection film 58 that partially prevents the growth of the plated electrode 56b.

In the third preferred embodiment, the entire lower surface of the plated electrode 56b in the opening is in direct contact with the interlayer insulating film 4. According to such a configuration, the dangling bond can be easily terminated by the hydrogen of the plated electrode 56b.

Fourth Preferred Embodiment

FIG. 23 is a cross-sectional view showing the configuration of the terminal region 30 of the semiconductor device 100, which is an RC-IGBT, according to the fourth preferred embodiment, that is, a cross-sectional view of the semiconductor device 100 taken along the dash-dotted line G-G shown in FIG. 1. FIG. 23 shows the terminal region 30 having an FLR structure. Although the barrier metal 5 is not provided in the fourth preferred embodiment, the barrier metal 5 may be provided as in the first preferred embodiment.

In the fourth preferred embodiment, the n⁻-type drift layer 1 provided in the terminal region 30 is included in the semiconductor portion. In the fourth preferred embodiment, the emitter electrode 6 includes the aluminum electrode 6a, which is a metal electrode, and the plated electrode 6b, and the terminal electrode 36 includes the aluminum electrode 36a, which is a metal electrode, and the plated electrode 36b. The openings of the aluminum electrodes 6a, 36a overlap the n⁻-type drift layer 1 of the terminal region 30 in plan view and are provided on the side opposite to the n⁻-type drift layer 1 with respect to the interlayer insulating film 4 in cross-sectional view. The openings of the aluminum electrodes 6a, 36a referred to here include at least one of the opening between the aluminum electrode 6a and the aluminum electrode 36a, the opening between the aluminum electrodes 6a, or the opening between the aluminum electrodes 36a.

The plated electrodes 6b, 36b are provided in the side walls of the openings of the aluminum electrodes 6a, 36a using the aluminum electrodes 6a, 36a as a material to be plated, and are provided on the aluminum electrodes 6a, 36a. However, the plated electrodes 6b, 36b may be provided at at least a portion of an inside of the openings of the aluminum electrodes 6a, 36a. In the fourth preferred embodiment, the entire lower surfaces of the plated electrodes 6b, 36b in the openings are in direct contact with the interlayer insulating film 4. However, at least a part of each lower surface of the plated electrodes 6b, 36b may be in direct contact with the interlayer insulating film 4, and for example, a part of each lower surface of the plated electrodes 6b, 36b may be in direct contact with the interlayer insulating film 4.

The manufacturing method according to the fourth preferred embodiment is the same as that in the first and second preferred embodiments in which the gate trench insulating film 11b and the pn junction 50 are replaced with the n⁻-type drift layer 1, and thus, the description thereof is omitted here.

Summary of Fourth Preferred Embodiment

According to the semiconductor device of the fourth preferred embodiment described above, the plated electrodes 6b, 36b are provided in the openings of the aluminum electrodes 6a, 36a, the opening overlapping the n⁻-type drift layer 1 in plan view and being provided on the side opposite to the n⁻-type drift layer 1 with respect to the interlayer insulating film 4 in cross-sectional view. According to such a configuration, hydrogen generated during the growth treatment of the plated electrodes 6b, 36b and hydrogen in the grown plated electrodes 6b, 36b pass through the interlayer insulating film 4 and are taken into at the interface between the interlayer insulating film 4 and the n⁻-type drift layer 1. Since the dangling bond corresponding to the interface state between the interlayer insulating film 4 and the n⁻-type drift layer 1 is terminated by the taken hydrogen, it is possible to stabilize the characteristics relating to the withstand voltage creep during avalanche, that is, the characteristics relating to the fluctuation of the withstand voltage. This is particularly effective in a semiconductor device in which the barrier metal 5 is not provided.

In the fourth preferred embodiment, the entire lower surfaces of the plated electrodes 6b, 36b in the openings are in direct contact with the interlayer insulating film 4. According to such a configuration, the dangling bond can be easily terminated by the hydrogen of the plated electrodes 6b, 36b.

Fifth Preferred Embodiment

Figure 24:
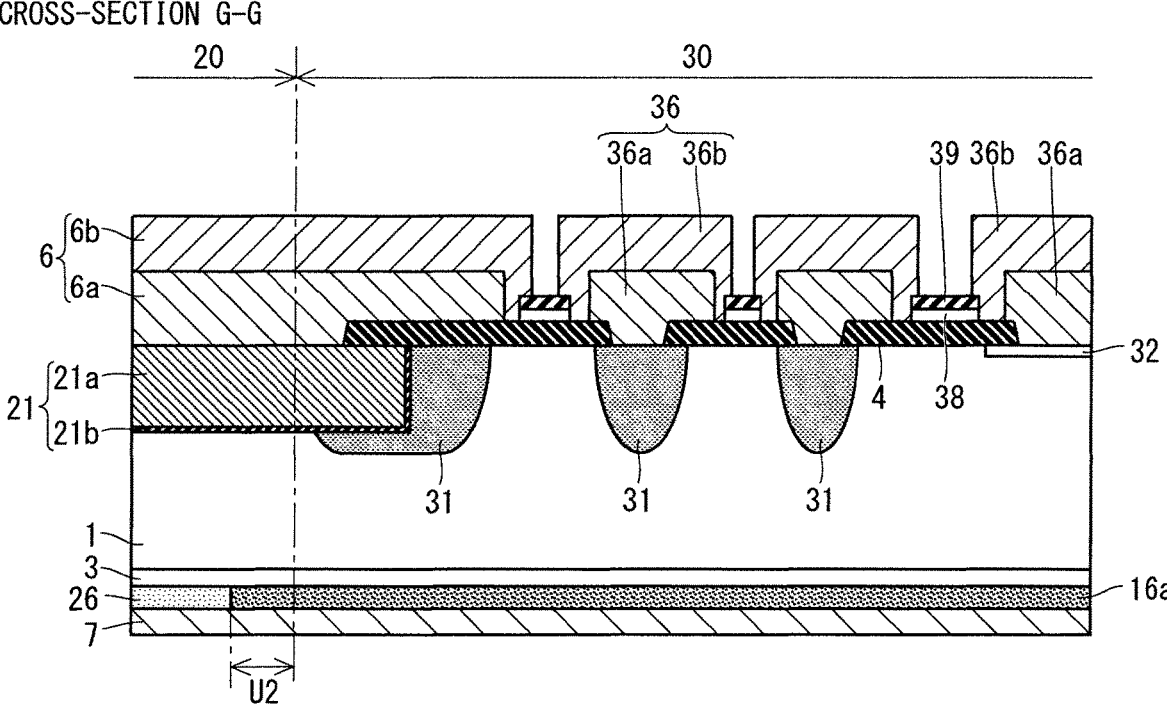
FIG. 24 is a cross-sectional view showing a configuration of a terminal region of a semiconductor device according to a fifth preferred embodiment.

FIG. 24 is a cross-sectional view showing the configuration of the terminal region 30 of the semiconductor device 100, which is an RC-IGBT, according to a fifth preferred embodiment. The configuration according to the fifth preferred embodiment shown in FIG. 24 is the same as the configuration according to the fourth preferred embodiment shown in FIG. 23 except that a semi-insulating protection film 38 and an insulating protection film 39 are added.

The plated electrodes 6b, 36b are formed in portions of the openings of the aluminum electrodes 6a, 36a other than the protection film 38. That is, the protection film 38 is provided in the openings of the aluminum electrodes 6a, 36a to separate the plated electrodes 6b, 36b. The separation of the plated electrodes 6b, 36b referred to here includes at least one of separation between the plated electrode 6b and the plated electrode 36b, separation between the plated electrodes 6b, or separation between the plated electrodes 36b.

Note that the semi-insulating protection film 38 may be a semi-insulating silicon nitride film such as sinSiN. The protection film 39, which is an insulating silicon nitride film, may be provided on the semi-insulating protection film 38. According to such a configuration, since the potential between the p-type terminal well layers 31 can be fixed by the protection film 38 or the like, the withstand voltage can be stabilized.

In the fifth preferred embodiment, the entire lower surfaces of the plated electrodes 6b, 36b in the openings are in direct contact with the interlayer insulating film 4. However, at least a part of each lower surface of the plated electrodes 6b, 36b may be in direct contact with the interlayer insulating film 4, and for example, a part of each lower surface of the plated electrodes 6b, 36b may be in direct contact with the interlayer insulating film 4.

Summary of Fifth Preferred Embodiment

According to the semiconductor device of the fifth preferred embodiment described above, the protection film 38 is provided in the opening of the aluminum electrodes 6a, 36a to separate the plated electrodes 6b, 36b. According to such a configuration, the shapes of the plated electrodes 6b, 36b can be made complicated due to the protection film 38 that partially prevents the growth of the plated electrodes 6b, 36b. In addition, since the potential between the p-type terminal well layers 31 can be fixed, stabilization of the withstand voltage can also be expected.

In the fifth preferred embodiment, the entire lower surfaces of the plated electrodes 6b, 36b in the openings are in direct contact with the interlayer insulating film 4. According to such a configuration, the dangling bond can be easily terminated by the hydrogen of the plated electrodes 6b, 36b.

Sixth Preferred Embodiment

FIG. 25 is a cross-sectional view showing the configuration of the terminal region 30 of the semiconductor device 100, which is an RC-IGBT, according to the sixth preferred embodiment, that is, a cross-sectional view of the semiconductor device 100 taken along the dash-dotted line G-G shown in FIG. 1. FIG. 25 shows the terminal region having an FLR structure. Although the barrier metal 5 is not provided in the sixth preferred embodiment, the barrier metal 5 may be provided as in the first preferred embodiment.

In the sixth preferred embodiment, similar to the first preferred embodiment, the p-type terminal well layer 31 is provided on the n⁻-type drift layer 1 of the terminal region 30, and the pn junction between the n⁻-type drift layer 1 and the p-type terminal well layer 31 is provided in the semiconductor substrate. The pn junction is included in the semiconductor portion.

In the sixth preferred embodiment, similar to the fourth preferred embodiment, the emitter electrode 6 includes the aluminum electrode 6a, which is a metal electrode, and the plated electrode 6b, and the terminal electrode 36 includes the aluminum electrode 36a, which is a metal electrode, and the plated electrode 36b. The openings of the aluminum electrodes 6a, 36a overlap the pn junction provided in the terminal region in plan view and are provided on the side opposite to the pn junction with respect to the interlayer insulating film 4 in cross-sectional view. The openings of the aluminum electrodes 6a, 36a referred to here include at least one of the opening between the aluminum electrode 6a and the aluminum electrode 36a, the opening between the aluminum electrodes 6a, or the opening between the aluminum electrodes 36a. In plan view, the opening may be provided along the pn junction or may be provided in a manner of overlapping a part of the pn junction.

The plated electrodes 6b, 36b are embedded in the openings of the aluminum electrodes 6a, 36a using the aluminum electrodes 6a, 36a as a material to be plated, and are provided on the aluminum electrodes 6a, 36a. However, the plated electrodes 6b, 36b may be provided at at least a portion of the inside of the openings of the aluminum electrodes 6a, 36a. In the sixth preferred embodiment, the entire lower surfaces of the plated electrodes 6b, 36b in the openings are in direct contact with the interlayer insulating film 4. However, at least a part of each lower surface of the plated electrodes 6b, 36b may be in direct contact with the interlayer insulating film 4, and for example, a part of each lower surface of the plated electrodes 6b, 36b may be in direct contact with the interlayer insulating film 4.

Summary of Sixth Preferred Embodiment

According to the semiconductor device of the sixth preferred embodiment described above, the plated electrodes 6b, 36b are provided in the openings of the aluminum electrodes 6a, 36a, the opening overlapping the pn junction of the terminal region 30 in plan view and being provided on the side opposite to the pn junction with respect to the interlayer insulating film 4 in cross-sectional view. According to such a configuration, the dangling bond of the pn junction of the terminal region 30 is terminated by the hydrogen of the plated electrode 6b, and thus, leakage current can be reduced, and the characteristics relating to leakage current can be stabilized. This is particularly effective in a semiconductor device in which the barrier metal 5 is not provided.

In the sixth preferred embodiment, the entire lower surfaces of the plated electrodes 6b, 36b in the openings are in direct contact with the interlayer insulating film 4. According to such a configuration, the dangling bond can be easily terminated by the hydrogen of the plated electrodes 6b, 36b.

Modifications of First to Sixth Preferred Embodiments

The first to sixth preferred embodiments may be combined as appropriate. That is, at least one of the gate trench insulating film 11b of the IGBT region 10, the pn junction 50 of the temperature sense diode region 62, the n⁻-type drift layer 1 of the terminal region 30, or the pn junction of the terminal region 30 may be configured to take into hydrogen from the plated electrodes. A configuration similar to that of the first preferred embodiment may be applied to the current sense region 63 shown in FIG. 19, and the aperture ratio of the opening may be different between the cell region and the current sense region 63. A configuration similar to that of the second preferred embodiment may be applied to the protection diode region 64 formed of polysilicon shown in FIG. 19.

Further, in the fourth to sixth preferred embodiments, both the emitter electrode 6 and the terminal electrode 36 are configured to include an aluminum electrode and a plated electrode, but the present invention is not limited thereto. For example, one of the emitter electrode 6 and the terminal electrode 36 may include an aluminum electrode and a plated electrode, and the other of the emitter electrode 6 and the terminal electrode 36 may include an aluminum electrode without including a plated electrode.

Figure 26:
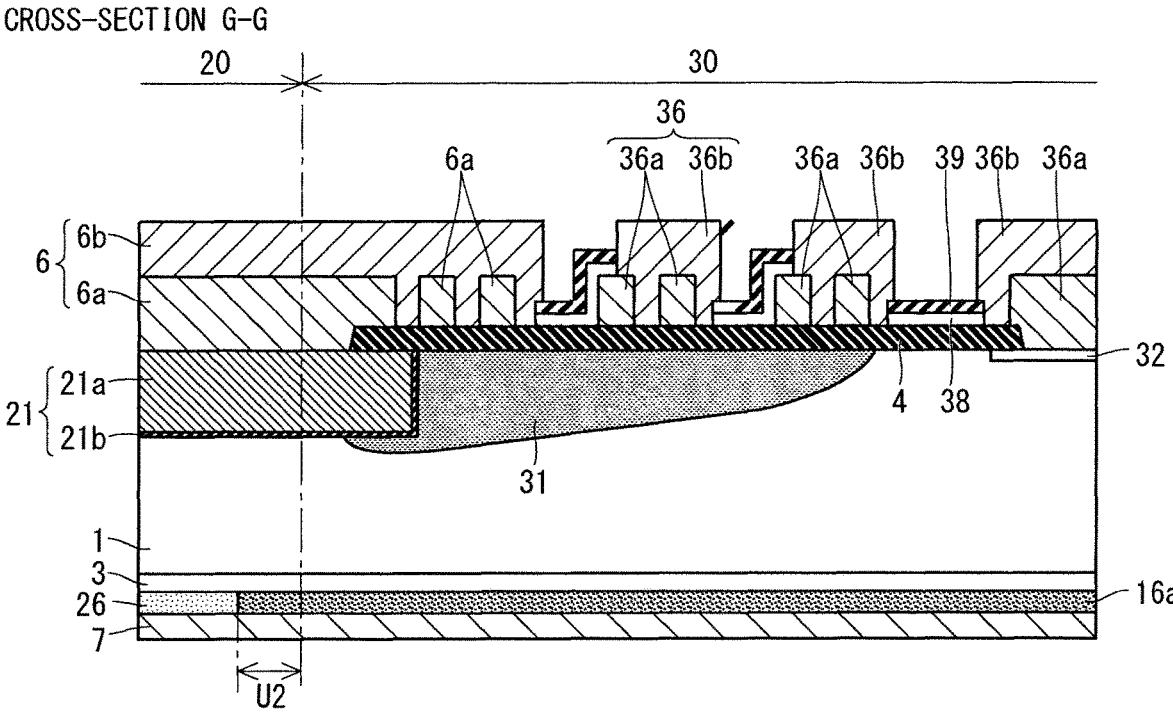
FIG. 26 is a cross-sectional view showing a configuration of a terminal region of a semiconductor device according to a modification.

In addition, although the terminal region 30 has the FLR structure in the fourth to sixth preferred embodiments, the terminal region 30 is not limited thereto and may have a VLD structure, for example. As an example thereof, FIG. 26 shows a VLD structure obtained by combining the fourth to sixth preferred embodiments. As shown in FIG. 26, as the boundary of the pn junction becomes deeper, the occupancy ratio per area of the openings of the aluminum electrodes 6a, 36a may be increased.

Note that each of the preferred embodiments and modifications can be freely combined and each of the preferred embodiments and modifications can be modified or omitted as appropriate.

Aspects of the present disclosure are collectively described below as supplementary notes.

Supplementary Note 1

A semiconductor device including:
a semiconductor substrate provided with a semiconductor portion which is at least one of a gate insulating film, a pn junction, or a drift layer of a terminal region;
an insulating film provided on the semiconductor portion;

a metal electrode having an opening that overlaps the semiconductor portion in plan view and is provided on a side opposite to the semiconductor portion with respect to the insulating film in cross-sectional view; and a plated electrode provided at at least a portion of an inside of the opening using the metal electrode as a material to be plated.

Supplementary Note 2

The semiconductor device according to supplementary note 1, wherein the semiconductor portion includes the gate insulating film provided in an active trench gate of an IGBT region of the semiconductor substrate, and at least a part of a lower surface of the plated electrode is in direct contact with the insulating film.

Supplementary Note 3

The semiconductor device according to supplementary note 2, wherein the entire lower surface of the plated electrode in the opening is in direct contact with the insulating film.

Supplementary Note 4

The semiconductor device according to any one of supplementary note 1 to supplementary note 3, wherein the semiconductor portion includes the pn junction provided in a temperature sense diode region of the semiconductor substrate, and at least a part of the lower surface of the plated electrode is in direct contact with the insulating film.

Supplementary Note 5

The semiconductor device according to supplementary note 4, wherein the entire lower surface of the plated electrode in the opening is in direct contact with the insulating film.

Supplementary Note 6

The semiconductor device according to supplementary note 4 or supplementary note 5, further including a semi-insulating protection film that is provided in the opening and separates the plated electrode.

Supplementary Note 7

The semiconductor device according to supplementary note 6, wherein the plated electrode is provided on a side wall of the opening, and the entire lower surface of the plated electrode in the opening is in direct contact with the insulating film.

Supplementary Note 8

The semiconductor device according to any one of supplementary note 1 to supplementary note 7, wherein the semiconductor portion includes the drift layer provided in the terminal region, and at least a part of the lower surface of the plated electrode is in direct contact with the insulating film.

Supplementary Note 9

The semiconductor device according to supplementary note 8, wherein the plated electrode is provided on the side wall of the opening, and the entire lower surface of the plated electrode in the opening is in direct contact with the insulating film.

Supplementary Note 10

The semiconductor device according to supplementary note 8 or supplementary note 9, further including a semi-insulating protection film that is provided in the opening and separates the plated electrode.

Supplementary Note 11

The semiconductor device according to any one of supplementary note 1 to supplementary note 10, wherein the semiconductor portion includes the pn junction provided in the terminal region, and at least a part of the lower surface of the plated electrode is in direct contact with the insulating film.

Supplementary Note 12

The semiconductor device according to supplementary note 11, wherein the entire lower surface of the plated electrode in the opening is in direct contact with the insulating film.

Supplementary Note 13

A method of manufacturing a semiconductor device, the method including:

forming a semiconductor portion which is provided on a semiconductor substrate and is at least one of a gate insulating film, a pn junction, or a drift layer of a terminal region, and an insulating film provided on the semiconductor portion;

forming a metal electrode having an opening that overlaps the semiconductor portion in plan view and is provided on a side opposite to the semiconductor portion with respect to the insulating film in cross-sectional view; and forming a plated electrode at at least a portion of an inside of the opening using the metal electrode as a material to be plated.

While the disclosure has been shown and described in detail, the foregoing description is in all aspects illustrative and not restrictive. It is therefore understood that numerous modifications and variations can be devised.

What is claimed is:

1. A semiconductor device comprising:

a semiconductor substrate provided with a semiconductor portion which is at least one of a gate insulating film, a pn junction, or a drift layer of a terminal region;

an insulating film provided on the semiconductor portion;

a metal electrode having an opening that overlaps the semiconductor portion in plan view and is provided on a side opposite to the semiconductor portion with respect to the insulating film in cross-sectional view; and a plated electrode provided at at least a portion of an inside of the opening using the metal electrode as a material to be plated, wherein the semiconductor portion includes the pn junction provided in a temperature sense diode region of the semiconductor substrate, and at least a part of the lower surface of the plated electrode is in direct contact with the insulating film.

2. The semiconductor device according to claim 1, wherein the semiconductor portion includes the gate insulating film provided in an active trench gate of an IGBT region of the semiconductor substrate.

3. The semiconductor device according to claim 2, wherein the entire lower surface of the plated electrode in the opening is in direct contact with the insulating film.

4. The semiconductor device according to claim 1, wherein the entire lower surface of the plated electrode in the opening is in direct contact with the insulating film.

5. The semiconductor device according to claim 1, the semiconductor device further comprising a semi-insulating protection film that is provided in the opening and separates the plated electrode.

6. The semiconductor device according to claim 5, wherein the plated electrode is provided on a side wall of the opening, and the entire lower surface of the plated electrode in the opening is in direct contact with the insulating film.

7. The semiconductor device according to claim 1, wherein the semiconductor portion includes the pn junction provided in the terminal region.

8. A semiconductor device comprising:

a semiconductor substrate provided with a semiconductor portion which is at least one of a gate insulating film, a pn junction, or a drift layer of a terminal region;

an insulating film provided on the semiconductor portion;

a metal electrode having an opening that overlaps the semiconductor portion in plan view and is provided on a side opposite to the semiconductor portion with respect to the insulating film in cross-sectional view; and a plated electrode provided at at least a portion of an inside of the opening using the metal electrode as a material to be plated, wherein the semiconductor portion includes the drift layer provided in the terminal region, the drift layer being in direct contact with the insulating film, and at least a part of the lower surface of the plated electrode is in direct contact with the insulating film.

9. The semiconductor device according to claim 8, wherein the plated electrode is provided on the side wall of the opening, and the entire lower surface of the plated electrode in the opening is in direct contact with the insulating film.

10. The semiconductor device according to claim 8, the semiconductor device further comprising a semi-insulating protection film that is provided in the opening and separates the plated electrode.

11. The semiconductor device according to claim 8, wherein the semiconductor portion includes the pn junction provided in the terminal region.

12. A method of manufacturing a semiconductor device, the method comprising:

forming a semiconductor portion that is provided on a semiconductor substrate and is at least one of a gate insulating film, a pn junction, or a drift layer of a terminal region, and an insulating film provided on the semiconductor portion;

forming a metal electrode having an opening that overlaps the semiconductor portion in plan view and is provided on a side opposite to the semiconductor portion with respect to the insulating film in cross-sectional view; and forming a plated electrode at at least a portion of an inside of the opening using the metal electrode as a material to be plated, wherein the semiconductor portion includes the pn junction provided in a temperature sense diode region of the semiconductor substrate, and at least a part of the lower surface of the plated electrode is in direct contact with the insulating film.

13. A method of manufacturing a semiconductor device, the method comprising:

forming a semiconductor portion that is provided on a semiconductor substrate and is at least one of a gate insulating film, a pn junction, or a drift layer of a terminal region, and an insulating film provided on the semiconductor portion;

forming a metal electrode having an opening that overlaps the semiconductor portion in plan view and is provided on a side opposite to the semiconductor portion with respect to the insulating film in cross-sectional view; and forming a plated electrode at at least a portion of an inside of the opening using the metal electrode as a material to be plated, wherein the semiconductor portion includes the drift layer provided in the terminal region, the drift layer being in direct contact with the insulating film, and at least a part of the lower surface of the plated electrode is in direct contact with the insulating film.

* * * * *